(12) United States Patent
Wakabayashi et al.

(10) Patent No.: US 7,195,669 B2
(45) Date of Patent: Mar. 27, 2007

(54) METHOD OF PRODUCING SILICON MONOCRYSTAL

(75) Inventors: Daisuke Wakabayashi, Tokyo (JP); Masao Saito, Tokyo (JP); Satoshi Sato, Tokyo (JP); Jun Furukawa, Tokyo (JP); Kounosuke Kitamura, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/521,035

(22) PCT Filed: Jul. 7, 2003

(86) PCT No.: PCT/JP03/08577

§ 371 (c)(1),
(2), (4) Date: Aug. 2, 2005

(87) PCT Pub. No.: WO2004/018742

PCT Pub. Date: Mar. 4, 2004

(65) Prior Publication Data
US 2006/0130737 A1    Jun. 22, 2006

(30) Foreign Application Priority Data
Jul. 5, 2002 (JP) .............................. 2002-197140

(51) Int. Cl.
*C30B 25/12* (2006.01)

(52) U.S. Cl. .............................. 117/17; 117/13; 117/19; 117/20

(58) Field of Classification Search .................. 117/13, 117/14, 19, 20, 201
See application file for complete search history.

(56) References Cited

U.S. PATENT DOCUMENTS

| 5,629,216 A * | 5/1997 | Wijaranakula et al. ..... 438/502 |
| 5,746,828 A * | 5/1998 | Boulaev ..................... 117/201 |
| 6,776,840 B1 * | 8/2004 | Fuerhoff et al. .............. 117/15 |

* cited by examiner

*Primary Examiner*—Felisa Hiteshew
(74) *Attorney, Agent, or Firm*—Reed Smith LLP

(57) ABSTRACT

A silicon single crystal rod (24) is pulled from a silicon melt (13) made molten by a heater (17), and a change in diameter of the silicon single crystal rod every predetermined time is fed back to a pulling speed of the silicon single crystal rod and a temperature of the heater, thereby controlling a diameter of the silicon single crystal rod. A PID control in which a PID constant is changed on a plurality of stages is applied to a method which controls the pulling speed of the silicon single crystal rod so that the silicon single crystal rod has a target diameter and a method which controls a heater temperature so that the silicon single crystal rod has the target temperature. A set pulling speed for the silicon single crystal rod is set so that V/G becomes constant, and an actual pulling speed is accurately controlled so as to match with the set pulling speed, thereby suppressing a fluctuation in diameter of the single crystal rod.

9 Claims, 15 Drawing Sheets

METHOD OF PRODUCING SILICON MONOCRYSTAL

TECHNICAL FIELD

The present invention relates to a method for manufacturing a silicon single crystal whose diameter is suppressed from being fluctuated by subjecting a silicon single crystal rod pulled up by a Czochralski method to a PID control.

BACKGROUND ART

As a method for controlling a silicon single crystal pulling speed, there has been conventionally known a first method which directly feeds back a deviation of a diameter during a silicon single crystal pulling operation to a single crystal rod pulling speed or a second method which directly feeds back a deviation of the diameter to a heater temperature.

On the other hand, with high integration of a semiconductor device in recent years, a design rule is further finely distinguished, and a subtle defect on a silicon wafer as a material greatly affects a device yield. Therefore, when a wafer is manufactured by slicing a pulled single crystal rod on a surface orthogonal to an axis thereof, a wafer which does not have a defect on an entire surface thereof must be produced. Thus, assuming that a temperature gradient in an axial direction in the vicinity of a solid-fluid interface during a single crystal rod pulling operation is G (° C./mm) and a pulling speed is V (mm/minute), it is important to set the pulling speed over a full length so that V/G becomes constant and perform a control to realize this set pulling speed. In order to maintain V/G over the full length, since the temperature gradient G is large at a top portion on the initial stage of the single crystal pulling operation and the temperature gradient becomes small from the top portion to a predetermined pulling position, when a pulling speed appropriate for a change in the temperature gradient G is set, the pulling speed at the top portion must be increased, and it is general to set the pulling speed to be gradually decreased to the predetermined pulling position.

However, since this difference in the set pulling speed becomes a difference in an actual pulling speed, there is a problem that improving the controllability in the top portion by the first method increases a fluctuation in diameter of any portion other than the top portion, and improving the controllability in any portion other than the top portion increases a fluctuation in diameter of the top portion.

Further, in the second method, since a control breadth of a heater temperature and a change breadth and a change time of a melting temperature vary depending on a positional relationship between a liquid level and the heater or a melt quantity, a control over the heater temperature becomes very difficult. A change direction of the actual pulling speed does not match with a correction direction of the heater temperature depending on situations, and a fluctuation in diameter may be possibly increased.

In order to solve such problems, there is disclosed a method for manufacturing a silicon single crystal which calculates a control value of a pulling speed of a silicon single crystal rod, calculates a correction quantity of a heater temperature by comparing the control value of the pulling speed with a set pulling speed in order to obtain a set output of the heater temperature and controls a diameter of the silicon single crystal rod before subjecting the control value of the pulling speed to a pulling speed span restriction and subjecting the calculated control value of the pulling speed to a span restriction (Japanese Patent Application Laid-open No. 2001-316199).

In the conventional method for manufacturing a silicon single crystal disclosed in Japanese Patent Application Laid-open No. 2001-316199, however, since the pulling speed control value is compared with the set pulling speed and a deviation obtained from this comparison is fed back to a heater temperature before span-restricting the pulling speed control value, there is a possibility that a correction quantity of the heater temperature cannot follow up a deviation of an actual pulling speed and a fluctuation in diameter of the single crystal rod is increased.

It is an object of the present invention to provide a method for manufacturing a silicon single crystal, by which a set pulling speed for a silicon single crystal rod is set so that V/G becomes fixed, an actual pulling speed can be accurately controlled so that the actual pulling speed matches with the set pulling speed and a fluctuation in diameter of the single crystal rod can be thereby suppressed.

It is another object of the present invention is to provide a method for manufacturing a silicon single crystal, by which generation of a defective portion in a silicon single crystal rod can be reduced or avoided by predicting presence/absence of generation of the defective portion when pulling up the silicon single crystal rod and correcting a set pulling speed and a set heater temperature.

DISCLOSURE OF THE INVENTION

As shown in FIGS. 1 and 2, the invention according to claim 1 is an improvement of a method for manufacturing a silicon single crystal rod which pulls a silicon single crystal rod 24 from a silicon melt 13 molten by a heater 17, detects a change in diameter of the silicon single crystal rod 24 in the pulling process every predetermined time, and feeds back an output of the detection to a pulling speed of the silicon single crystal rod 24 and a temperature of the heater 17, thereby controlling a diameter of the silicon single crystal rod 24.

A characteristics configuration of this method is that wherein a PID control in which a PID constant is changed on a plurality of stages is applied to a method which controls the pulling speed of the silicon single crystal rod so that the silicon single crystal rod 24 has a target diameter and a method which controls the temperature of the heater 17 so that the silicon single crystal rod 24 has the target diameter.

In this method for manufacturing a silicon single crystal defined in claim 1, the set pulling speed is high and a fluctuation in diameter also tends to be large when pulling up a top portion of the silicon single crystal rod 24, and a control which gives precedence to a diameter control over the silicon single crystal rod 24 is performed by setting a large PID constant in the PID control to increase a correction quantity of the pulling speed with respect to a diameter deviation of the silicon single crystal rod 24 in order to stabilize a diameter of this top portion in early stages. On the other hand, the set pulling speed is lower than that of the top portion when pulling up a portion following the top portion of the silicon single crystal rod 24 and a fluctuation in diameter also tends to be small, and a control which gives precedence to the pulling speed control over the silicon single crystal rod 24 is performed by gradually reducing the PID constant in the PID control to decrease a correction quantity of the pulling speed with respect to a diameter deviation of the silicon single crystal rod 24 in order to pull up the stable silicon single crystal rod 24 having no defect.

In this example, the "PID control on a plurality of stages" in claim 1 means gradually changing the PID constant in the PID control as described above.

As shown in FIGS. 1 and 2, the invention according to claim 2 is characterized in that a method which directly feeds back a diameter deviation between a target diameter and a measured diameter of the silicon single crystal rod 24 to a method which subjects the pulling speed of the silicon single crystal rod 24 to a PID control so that the silicon single crystal rod 24 has the target diameter is combined with a method which feeds back a change quantity of the diameter deviation as a deviation to a current pulling speed.

In the method for manufacturing a silicon single crystal according to claim 2, in pulling of a portion following the top portion of the silicon single crystal rod 24, a diameter deviation between the target diameter and the measured diameter of the silicon single crystal rod 24 is determined as a reference in the PID control feedback to a previous pulling speed, and a change quantity of the diameter deviation between the target diameter and the measured diameter of the current silicon single crystal rod 24 is determined as a deviation in order to correct the previous pulling speed. As a result, a fluctuation in pulling speed of the silicon single crystal rod 24 is further suppressed when pulling up the portion following the top portion.

As shown in FIGS. 1 and 2, the invention according to claim 3 is characterized in that, when feeding back a change quantity of a diameter deviation between a target diameter and a measured diameter of the silicon single crystal rod 24 as a deviation to the pulling speed of the silicon single crystal rod 24, the pulling speed is subjected to a PID control so as not to exceed a maximum fluctuation breadth of correction with respect to a current pulling speed.

In the method for manufacturing a silicon single crystal according to claim 3, in an operation for pulling up the silicon single crystal rod 24, when determining a previous pulling speed for the silicon single crystal rod 24 as a reference and feeding back a change quantity of a diameter deviation of the silicon single crystal rod 24 as a deviation to a current pulling speed for the silicon single crystal rod 24, if a maximum fluctuation breadth of correction for the current pulling speed is exceeded, this correction is restricted to the maximum fluctuation breadth, thereby suppressing a fluctuation in the pulling speed for the silicon single crystal rod 24 to the minimum level.

The invention according to claim 4 is the invention according to any of claims 1 to 3 and, as shown in FIGS. 3 to 5 and FIG. 11, characterized in that a quality prediction calculation for the silicon single crystal rod 24 is performed by using a pulling speed actual measurement profile from start of pulling to a predetermined time and a set pulling speed from start of pulling to end of pulling concurrently with pulling of the silicon single crystal rod 24. When generation of the defective portion is predicted, a corrected pulling speed of the silicon single crystal rod 24 and a corrected heater temperature which are used to correct the defective portion are calculated, and the corrected pulling speed and the corrected heater temperature are fed back to the set pulling speed and the set heater temperature.

In the method for manufacturing a silicon single crystal according to claim 4, in the operation for pulling up the silicon single crystal rod 24, even if a measured pulling speed exceeds a range of a set pulling speed in order to maintain a predetermined diameter, since the quality prediction calculation of the silicon single crystal rod 24 is sequentially simultaneously performed based on the actual results and the setting of the pulling speed, presence/absence of occurrence of a defective portion can be sequentially predicted. As a result, a corrected pulling speed of the silicon single crystal rod 24 and a corrected heater temperature which are used to correct the defective portion are calculated and the corrected pulling speed and the corrected heater temperature are fed back, thereby reducing or avoiding occurrence of the defective portion.

The invention according to claim 5 is the invention according to claim 4 and, as shown in FIGS. 6 to 12, characterized in that the quality prediction calculation and the corrected pulling speed calculation for the silicon single crystal rod 24 are performed by a defect simulation method which maximizes a non-defective area in the silicon single crystal rod 24 by using a computer, the defect simulation method comprising: a step of obtaining a temperature distribution in the silicon single crystal rod 24 which grows from the silicon melt 13 while taking a convection of the silicon melt 13 into consideration under a condition for manufacturing the silicon single crystal rod 24 with a parameter $P_1$; a step of predicting concentration distributions and size distributions of a void and a high-temperature oxygen precipitate in the silicon single crystal rod 24 by obtaining the temperature distribution in the silicon single crystal rod 24 in the cooling process; a step of obtaining a difference between a maximum value of an inflection point of a first isoconcentration line and a minimum value of an inflection point of a first distribution line by a calculation after acquiring the first isoconcentration line and the first distribution line in the silicon single crystal rod 24 by a calculation; a step of obtaining the difference between the maximum value of the inflection point of the first isoconcentration line and the minimum value of the inflection point of the first distribution line by the calculation while sequentially changing the parameter in the condition for manufacturing the silicon single crystal rod 24 from $P_2$ to $P_N$; and a step of obtaining a condition for manufacturing the silicon single crystal rod 24 under which the difference between the maximum value of the inflection point of the first isoconcentration line and the minimum value of the inflection point of the first distribution line becomes maximum.

In the method for manufacturing a silicon single crystal according to claim 5, not only a temperature distribution in the silicon single crystal rod 24 which grows from the silicon melt 13 is obtained taking a convection of the silicon melt 13 into consideration under a manufacturing condition for the silicon single crystal rod 24 with a parameter $P_1$, but also a temperature distribution in the silicon single crystal rod 24 in a cooling process is obtained, i.e., effects of gradual cooling and rapid cooling of the silicon single crystal rod 24 in the cooling process of the silicon single crystal rod 24 separated from the silicon melt 13 is taken into consideration and analyzed. As a result, a concentration distribution and a size distribution of a void in the silicon single crystal rod 24 are predicted, and a concentration distribution and a size distribution of a high-temperature oxygen precipitate in the silicon single crystal rod 24 are also predicted. Subsequently, a first isoconcentration line $HC1_X$ and a first distribution line $BC1_X$ in the silicon single crystal rod 24 are obtained based on the calculation, and then a difference $\Delta Z_1$ between a maximum value of an inflection point of the first isoconcentration line $HC1_X$ and a minimum value of an inflection point of the first distribution line $BC1_X$ is acquired based on the calculation.

Then, the parameter of the manufacturing condition for the silicon single crystal rod 24 is sequentially changed from $P_2$ to $P_N$, and the difference $\Delta Z_1$ between the maximum value of the inflection point of the first isoconcentration line $HC1_X$ and the minimum value of the inflection point of the first distribution line $BC1_X$ is acquired based on the calculation like the above. Additionally, a single crystal manufacturing condition under which the difference $\Delta Z_1$ between the maximum value of the inflection point of the first isoconcentration line $HC1_X$ and the minimum value of the inflection point of the first distribution line $BC1_X$ becomes maximum is obtained. As a result, the manufacturing condition for the silicon single crystal rod 24 under which a non-defective area expands on the maximum level in the pulling direction and the radial direction of the single crystal 14 can be accurately obtained based on the calculation.

The invention according to claim 6 is the invention according to claim 4 and, as shown in FIGS. 11 and 12, characterized in that the quality prediction calculation and the corrected pulling speed calculation for the silicon single crystal rod 24 are performed by a defect simulation method which maximizes a non-defective area in the silicon single crystal rod 24 by using a computer, the defect simulation method comprising: a step of obtaining a temperature distribution in the silicon single crystal rod 24 which grows from the silicon melt 13 while taking a convection of the silicon melt 13 into consideration under a condition for manufacturing the silicon single crystal rod 24 with a parameter $P_1$; a step of predicting concentration distributions and size distributions of a void and a high-temperature oxygen precipitate in the silicon single crystal rod 24 by obtaining the temperature distribution in the silicon single crystal rod 24 in the cooling process; a step of obtaining a difference between a maximum value of an inflection point of a second isoconcentration line and a minimum value of an inflection point of a second distribution line by a calculation after acquiring the second isoconcentration line and the second distribution line in the silicon single crystal rod 24 by a calculation; a step of obtaining the difference between the maximum value of the inflection point of the second isoconcentration line and the minimum value of the inflection point of the second distribution line by the calculation while sequentially changing the parameter in the condition for manufacturing the silicon single crystal rod 24 from $P_2$ to $P_N$; and a step of obtaining a condition for manufacturing the silicon single crystal rod 24 under which the difference between the maximum value of the inflection point of the second isoconcentration line and the minimum value of the inflection point of the second distribution line becomes maximum.

In the method for manufacturing a silicon single crystal according to claim 6, a concentration distribution and a size distribution of a void in the silicon single crystal rod 24 are predicted under the manufacturing condition for the silicon single crystal rod 24 with the parameter $P_1$ like claim 5, and a concentration distribution and a size distribution of a high-temperature oxygen precipitate in the silicon single crystal rod 24 are also predicted. Subsequently, a second isoconcentration line $HC2_X$ and a second distribution line $BC2_X$ in the silicon single crystal rod 24 are obtained based on the calculation, and then a difference $\Delta Z_2$ between a maximum value of an inflection point of the second isoconcentration line $HC2_X$ and a minimum value of an inflection point of the second distribution line $BC2_X$ is acquired based on the calculation.

Then, the parameter in the manufacturing condition for the silicon single crystal rod 24 is sequentially changed from $P_2$ to $P_N$, and the difference $\Delta Z_2$ between the maximum value of the inflection point of the second isoconcentration line $HC2_X$ and the minimum value of the inflection point of the second distribution line $BC2_X$ is obtained based on the calculation like the above. Further, the manufacturing condition for the silicon single crystal rod 24 under which the difference $\Delta Z_2$ between the maximum value of the inflection point of the second isoconcentration line $HC2_X$ and the minimum value of the inflection point of the second distribution line $BC2_X$ becomes maximum is obtained. As a result, the manufacturing condition for the silicon single crystal rod 24 under which a non-defective area expands on the maximum level in the pulling direction and the radial direction of the silicon single crystal rod 24 can be accurately obtained based on the calculation.

BEST MODE FOR CARRYING OUT THE INVENTION

A first embodiment according to the present invention will now be described with reference to the accompanying drawings.

Figure 1:
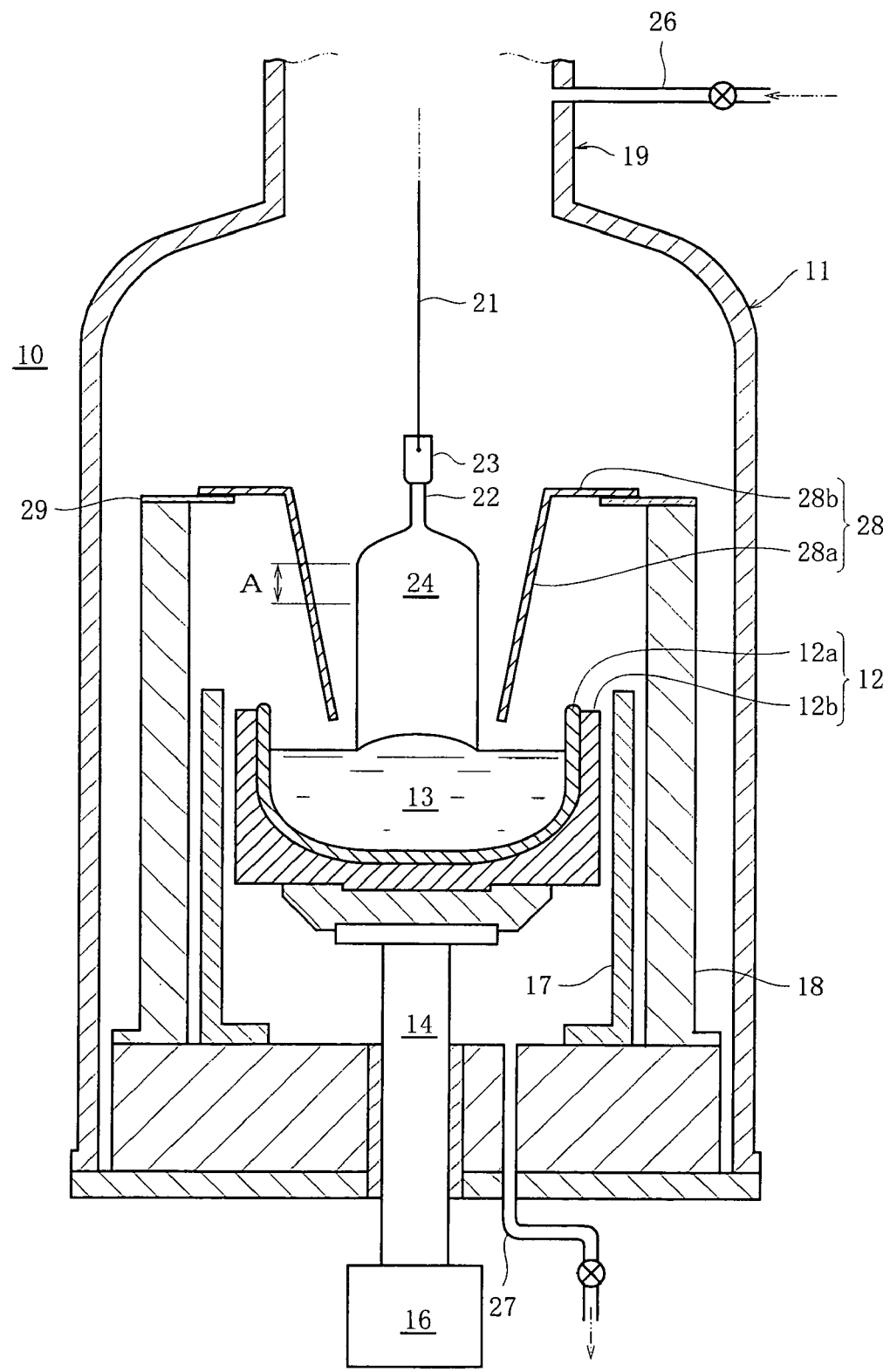
FIG. 1 is a longitudinal cross-sectional view showing a silicon single crystal pulling apparatus according to first and second embodiments of the present invention.

As shown in FIG. 1, a silicon single crystal pulling apparatus 10 comprises a main chamber 11 which can form a vacuum therein, and a crucible 12 provided at the center in this chamber. The main chamber 11 is a cylindrical vacuum vessel. Further, the crucible 12 comprises a cylindrical inner layer vessel 12a with a bottom which is formed of quartz and in which a silicon melt 13 is stored, and a cylindrical outer layer vessel 12b with a bottom which is formed of black lead and fitted on the outer side of the inner layer vessel 12a. An upper end of a shaft 14 is connected with a bottom surface of the outer layer vessel 12b, and crucible driving means 16 for rotating and moving up and down the crucible 12 is provided at an lower end of this shaft 14 through the shaft. Furthermore, an outer peripheral surface of the crucible 12 is surrounded by a cylindrical heater 17 with a predetermined gap therebetween, and an outer peripheral surface of this heater 17 is surrounded by a cylindrical heat reserving cover 18 with a predetermined gap therebetween.

On the other hand, a cylindrical pull chamber 19 having a diameter smaller than that of the main chamber is connected with an upper end of the main chamber 11. Seed pulling means (not shown) is provided at an upper end of this pull chamber, and a lower end of this seed pulling means is configured to rotate and move up and down a pulling shaft 21 reaching a surface of the silicon melt 13 in the main chamber 11. A seed chuck 23 is provided at a lower end of this pulling shaft 21, and this chuck is configured to hold a seed crystal 22. After a lower end of this seed crystal 22 is soaked in the silicon melt 13, a silicon single crystal rod 24 is pulled and grown from the lower end of the seed crystal 22 by respectively rotating and moving up the seed crystal 22 and the crucible 12 by using the seed pulling means.

Moreover, a diameter of the silicon single crystal rod 24 in the vicinity of a solid-fluid interface during the pulling operation is detected by a diameter detection sensor (not shown) every predetermined time. This diameter detection sensor is constituted of a CCD camera, a radiation thermometer or the like. A detection output from the diameter detection sensor is connected with a control input of a controller (not shown), and a control output from the controller is connected with the heater 17, the seed pulling means and the crucible driving means 16. Additionally, a memory is provided to the controller. This memory stores as a map a target diameter of the silicon single crystal rod 24 to be pulled up, a set pulling speed which is set over the entire length of the silicon single crystal rod 24 so that V/G becomes constant, and a set heater temperature which is set over the entire length of the silicon single crystal rod 24 so that V/G becomes constant. In this example, V is a pulling speed for the silicon single crystal rod 24, and G is a temperature gradient in an axial direction in the vicinity of the solid-fluid interface when pulling the silicon single crystal rod 24.

Figure 2:
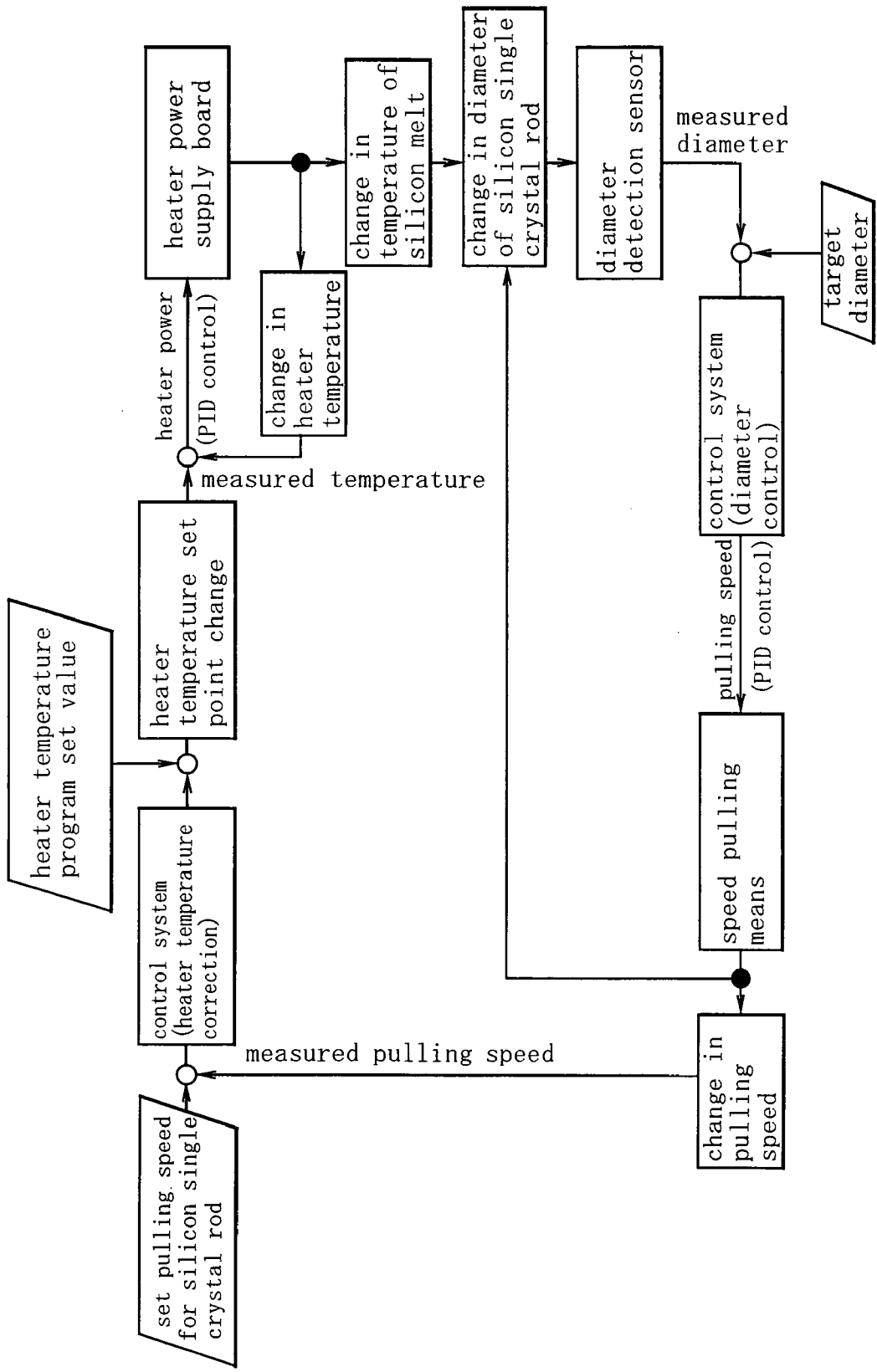
FIG. 2 is a block diagram showing a control when pulling up the silicon single crystal rod.
Figure 3:
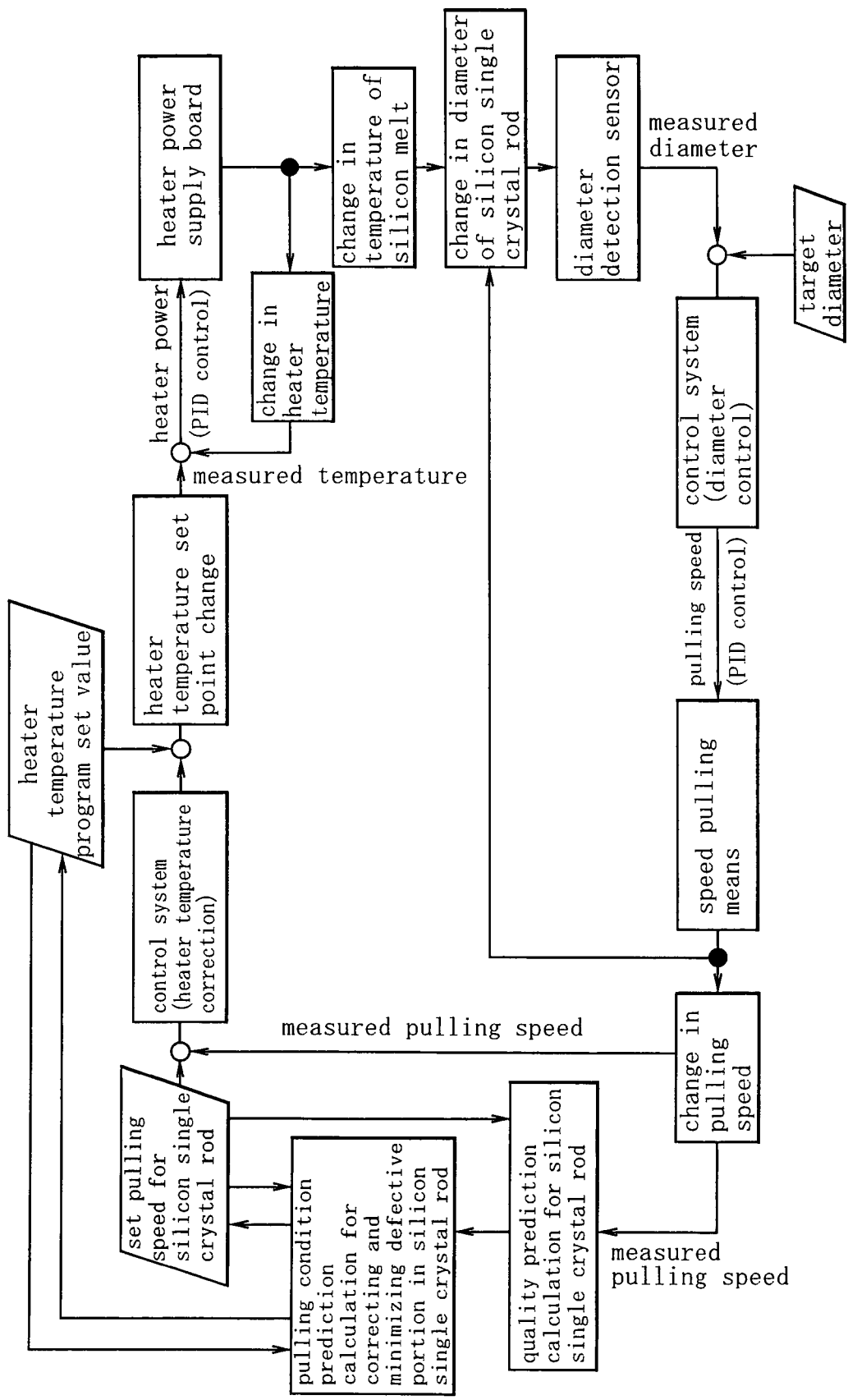
FIG. 3 is a block diagram showing a control when pulling a silicon single crystal rod according to a third embodiment of the present invention.

The controller controls the heater 17, the seed pulling means and the crucible driving means 16 based on a detection output from the diameter detection sensor. That is, as shown in FIGS. 1 and 2, the controller is configured to control a diameter of the silicon single crystal rod 24 by feeding back the detection output indicative of a change in diameter to the heater 17, the seed pulling means and the crucible driving means 16. As a method for controlling a diameter of the silicon single crystal rod 24, there are used a method for performing a PID control while giving precedence to a pulling speed for the silicon single crystal rod 24 so that a diameter of the silicon single crystal rod 24 becomes the target diameter and a method for performing the PID control while giving precedence to a temperature of the heater 17 so that a diameter of the silicon single crystal rod 24 becomes the target diameter, and the PID control in which a PID constant is changed on a plurality of stages is applied to these methods. It is to be noted that the PID controls is one scheme of the feedback control, and this is a control using a signal which is in proportion to an output from the system, a signal obtained by integrating an output from the system and a signal obtained by differentiating an output from the system as feedback signals.

Specifically, the controller is configured to give precedence to the diameter control when pulling a top portion of the silicon single crystal rod 24, give precedence to the pulling speed control when pulling a portion following the top portion, and control the pulling speed based on the expression (A).

$$V_n = Vs + PKp(Vm/Vt)\left[d_n + IKi(Vm/Vt)\sum \{(d_{n-1}+d_n)/2\}\times \Delta t + DKd(Vm/Vt)\{(d_n - d_{n-1})/\Delta t\}\times \exp(-t/T)\right] \quad (A)$$

In the expression (A), $V_n$ is a pulling speed which should be controlled, Vs is a set pulling speed, Vm/Vt is an inclination of a PID constant with pulling of the top portion of the silicon single crystal rod 24 being determined as a reference, P is a P constant in the top portion in the PID control, I is an I constant in the top portion in the PID control, D is a D constant in the top portion in the PID control, Kp is a correction coefficient of the P constant, Ki is a correction coefficient of the I constant, Kd is a correction coefficient of the D constant, $d_n$ is a current diameter deviation between a target diameter and a measured diameter, $d_{n-1}$ is a previous diameter deviation between a target diameter and a measured diameter, $\Delta t$ is a sampling time, t is a time from 0 to $\Delta t$, and T is a time constant. Furthermore, PKp(Vm/Vt) is a P constant term, Iki(Vm/Vt) is an I constant term, and DKd(Vm/Vt) is a D constant term. It is to be noted that the term "top portion" means a fixed form length of approximately 100 mm from a fixed form portion of 0 mm in the pulled silicon single crystal rod 24, i.e., a range A up to approximately 100 mm after the diameter of the silicon single crystal rod 24 becomes constant in this specification.

A method for manufacturing the thus configured silicon single crystal will now be described with reference to FIGS. 1 and 2.

When pulling the top portion of the silicon single crystal rod 24, the set pulling speed is high and a fluctuation in diameter is large. Therefore, the controller sets the P constant term, the I constant term and the D constant term in the expression (A) to be large. That is, when pulling the top portion, since the inclination Vm/Vt of the PID constant is large, the P constant term, the I constant term and the D constant term become large. As a result, a correction quantity of the pulling speed with respect to a diameter deviation becomes large, and precedence is given to the diameter control. Therefore, a fluctuation in diameter in the top portion can be rapidly stabilized.

On the other hand, when pulling a portion following the top portion, since the set pulling speed is low and a fluctuation in diameter is small, the P constant term, the I constant term and the D constant term become small by setting the inclination Vm/Vt of the PID constant to be small by the controller when pulling the portion following the top portion. As a result, a correction quantity of the pulling speed with respect to a diameter deviation becomes small and precedence is given to the pulling speed control. Therefore, it is possible to effect the diameter control with a fluctuation in pulling speed for the portion following the top portion being minimized.

Incidentally, in this embodiment, in case of giving precedence to the diameter control, even when a heater temperature is corrected based on a heater temperature map set over the entire length of the silicon single crystal rod, a position of the solid-fluid interface and each detection output indicative of a residual quantity of the melt, a correction quantity of the heater temperature may be calculated and added as a relational expression of the set pulling speed. That is, a fluctuation in pulling speed can be rapidly suppressed by storing a correction quantity of the heater temperature based on a quantity of the melt and a solid-fluid interface position in the memory as a map, further correcting this correction quantity based on a degree of the set pulling speed or correcting the PID constant of the heater temperature as a function of the set pulling speed. As a result, even when giving precedence to the diameter control, a wafer obtained by slicing the silicon single crystal rod can be formed without defect on the entire surface thereof.

A second embodiment according to the present invention will now be described.

In this embodiment, a method which directly feeds back a diameter deviation between a target diameter and a measured diameter of a silicon single crystal rod 24 to the method which subjects a pulling speed of the silicon single crystal rod 24 to the PID control so that the silicon single crystal rod 24 has the target diameter is combined with a method which feeds back a change quantity of the diameter deviation as a deviation to a current pulling speed, thereby effecting the control so that the silicon single crystal rod 24 has the target diameter.

A pulling speed is controlled based on the expression (A) described in conjunction with the first embodiment when giving precedence to the diameter control, and the pulling speed is controlled based on the following expression (B) when giving precedence to the pulling speed control.

$$V_n = V_{n-1} + P[d_n - d_{n-1} + I\{(d_{n-1} + d_n)/2\} \times \Delta t + \qquad (B)$$
$$D(d_n + 2d_{n-1} - 6d_{n-2} + 2d_{n-3} + d_{n-4})/(6\Delta t)]$$

Here, in the expression (B), $V_n$ is a current pulling speed which should be controlled, $V_{n-1}$ is a previous pulling speed which should be controlled, P is a P constant in the PID control, I is an I constant in the PID control, D is a D constant in the PID control, $d_n$ is a diameter deviation between a target diameter and a measured diameter obtained this time, $d_{n-1}$ is a diameter deviation of a target diameter and a measured diameter previously obtained, $d_{n-2}$ is a diameter deviation of a target diameter and a measured diameter obtained two times before, $d_{n-3}$ is a diameter deviation between a target diameter and a measured diameter three times before, $d_{n-4}$ is a diameter deviation between a target diameter and a measured diameter obtained four times before, and $\Delta t$ is a sampling time. It is to be noted that, in the expression (B), the pulling speed $V_n$ is controlled in such a manner that an absolute value of a difference between the current pulling speed $V_n$ which should be controlled and the previous pulling speed $V_{n-1}$ which should be controlled does not exceed a predetermined fluctuation breadth of the pulling speed.

A method for manufacturing the thus configured silicon single crystal will now be described.

When pulling a top portion of the silicon single crystal rod 24, the set pulling speed is high and a fluctuation in diameter is large like the first embodiment. Therefore, the controller sets the P constant, the I constant and the D constant in the expression (A) to be large. That is, since the inclination Vm/Vt of the PID constant is large when pulling the top portion, the P constant, the I constant and the D constant become large. As a result, since a correction quantity of the pulling speed with respect to a diameter deviation becomes large and precedence is given to the diameter control, and hence a fluctuation in diameter of the top portion can be rapidly stabilized.

On the other hand, when pulling a portion following the top portion, a fluctuation in pulling speed of the silicon single crystal rod 24 can be further suppressed by calculating the current pulling speed by using the expression (B). Specifically, assuming that a previously obtained diameter deviation as a difference between a measured diameter and a target diameter is $\delta_{n-1}$ and a currently obtained diameter deviation is a deviation $\delta_n$ with the previous pulling speed $V_{n-1}$ which should be controlled being determined as a reference, since the previous pulling speed $V_{n-1}$ which should be controlled is corrected based on a value obtained by subtracting the deviation $\delta_{n-1}$ from the deviation $\delta_n$, a fluctuation in pulling speed of the silicon single crystal rod 24 can be further suppressed.

Incidentally, in the second embodiment, when a change quantity of the diameter deviation between the target diameter and the measured diameter of the silicon single crystal rod 24 is fed back as a deviation to the pulling speed of the silicon single crystal rod 24, it is preferable to subject the pulling speed to the PID control so that a maximum fluctuation breadth of the correction with respect to the current pulling speed is not exceeded. Specifically, when feeding back the previous pulling speed $V_{n-1}$ which should be controlled to the next pulling speed $V_n$ which should be controlled (the current pulling speed which should be controlled), it is preferable to set a limit to the pulling speed so that a change quantity of the pulling speed does not exceed a maximum correction quantity $H_0$ and control to suppress a fluctuation in the pulling speed. As a result, in the pulling operation for the portion following the top portion of the silicon single crystal rod 24, when the previous pulling speed of the silicon single crystal rod 24 is determined as a reference and a change quantity of the diameter deviation of the silicon single crystal rod 24 is fed back as a change quantity to the current pulling speed of the silicon single crystal rod 24, if the maximum fluctuation breadth of the correction with respect to the current pulling speed is exceeded, this correction is suppressed to the maximum fluctuation breadth, thereby minimizing a fluctuation in the pulling speed of the silicon single crystal rod 24.

FIGS. 3 to 12 show a third embodiment according to the present invention.

Figure 4:
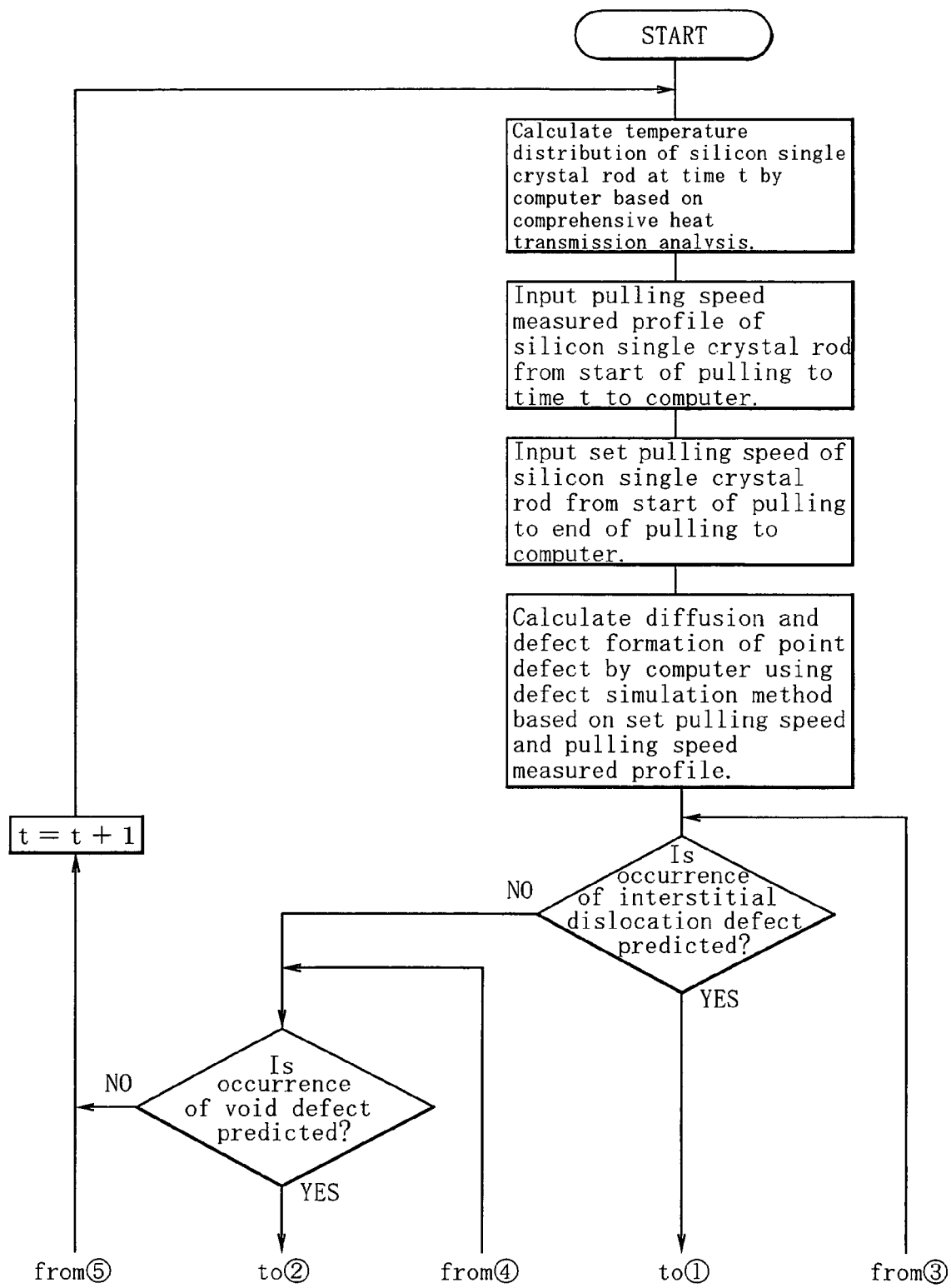
FIG. 4 is a flowchart showing a first half stage required to predict the quality of the silicon single crystal rod.
Figure 5:
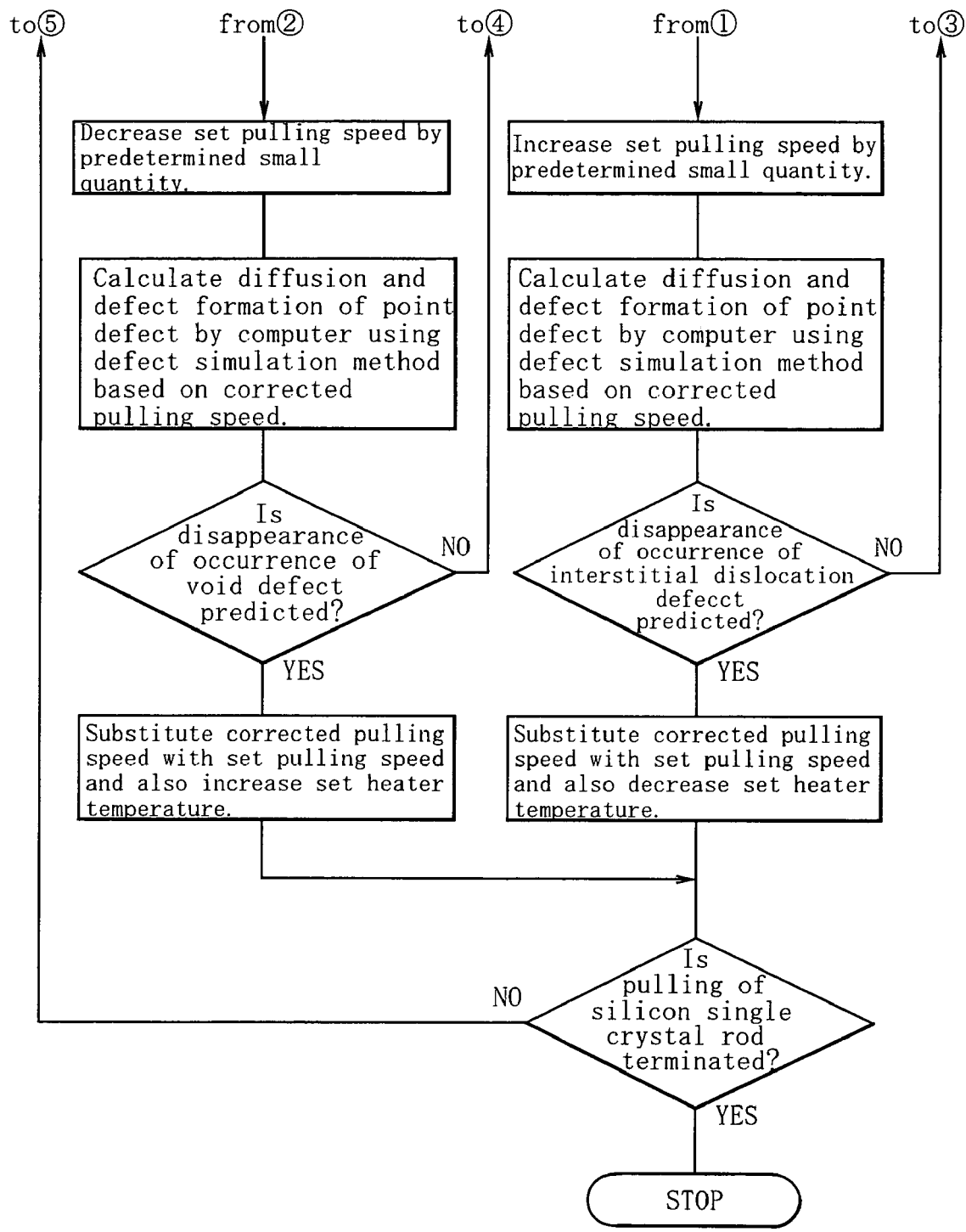
FIG. 5 is a flowchart showing a last half stage required to predict the quality of the silicon single crystal rod.
Figure 11:
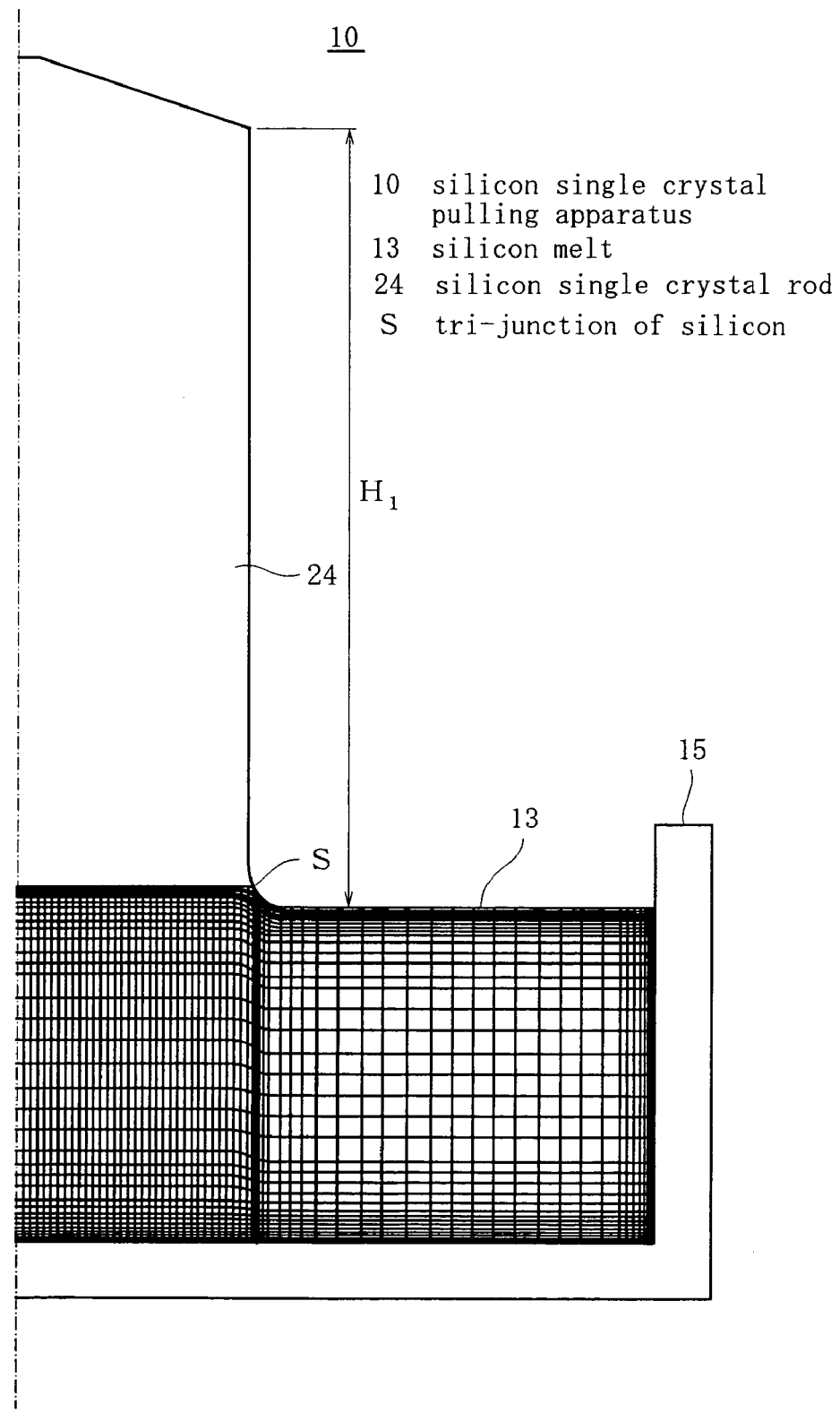
FIG. 11 is a primary cross-sectional view of a pulling machine for the silicon single crystal in which a silicon melt has a mesh structure.

In this embodiment, a quality prediction calculation based on a defect simulation of a silicon single crystal rod 24 is added to the method for manufacturing the silicon single crystal rod 24 according to the first or second embodiment (FIGS. 3 to 5 and FIG. 11). That is, as shown in FIGS. 4, 5 and 11, a temperature distribution of the silicon single crystal rod 24 is first calculated by using a computer based on a comprehensive heat transmission analysis every predetermined time from start of pulling the silicon single crystal rod 24. Additionally, in the actual pulling operation for the silicon single crystal rod 24, a pulling speed actual measurement profile from start of pulling to a predetermined time t and a set pulling speed from start of puling to end of pulling are input to the computer. A quality prediction calculation for the silicon single crystal rod 24 is performed concurrently with pulling of the silicon single crystal rod 24 based on these sets of data and conditions, and whether a defective portion is generated in the silicon single crystal rod 24 is predicted by using this prediction calculation.

Specifically, when it is predicted that an interstitial dislocation defect is generated in the silicon single crystal rod 24, the set pulling speed is increased and corrected by a predetermined small quantity $\Delta\delta$, and diffusion and defect formation of a point defect are calculated by a computer using a later-described defect simulation method based on this corrected pulling speed. After the calculation, when it is predicted that an interstitial dislocation defect still occurs, the set pulling speed is further increased and corrected by $\delta\Delta$, and diffusion and defect formation of a point defect are likewise calculated by the computer using the defect simulation method based on this corrected pulling speed. This calculation is repeated until it is predicted that an interstitial dislocation defect is no longer generated. When it is predicted that an interstitial dislocation defect is no longer generated, the corrected pulling speed is substituted with the set pulling speed and, at the same time, a set heater temperature is decreased by a predetermined value. As a result, occurrence of a defective portion in the silicon single crystal rod 24 can be reduced or avoided. In this example, the interstitial dislocation defect (which will be referred to as an L/DL hereinafter) means a dislocation defect formed by aggregation of excessive interstitial silicon.

On the other hand, when it is predicted that a void defect is generated in the silicon single crystal rod 24, the set pulling speed is reduced and corrected by a predetermined small quantity $\Delta\delta$, and diffusion and defect formation of a point defect are calculated by the computer using the defect simulation method based on the corrected pulling speed. After the calculation, when it is predicted that a void defect still occurs, the set pulling speed is further decreased and corrected by $\Delta\delta$, and diffusion and defect formation of the point defect are likewise calculated by the computer using the defect simulation method based on the corrected pulling speed. This calculation is repeated until it is predicted that a void defect is no longer generated. When it is predicted that a void defect is no longer generated, the corrected pulling speed is substituted with the set pulling speed and, at the same time, the set heater temperature is increased by a predetermined value. As a result, occurrence of a defective portion in the silicon single crystal rod 24 can be reduced or avoided. In this example, the void defect means a vacancy defect formed by aggregation of excessive vacancies.

The quality prediction calculation for the silicon single crystal rod 24 and the corrected pulling speed calculation are performed by the defect simulation method for the silicon single crystal rod 24, i.e., by obtaining a concentration distribution and a size distribution of a void in the silicon single crystal rod 24 by using the computer and then acquiring a concentration distribution and a size distribution of a high-temperature oxygen precipitate in the silicon single crystal rod 24 by using the computer.

[1] Concentration Distribution and Size Distribution of Void in Silicon Single Crystal Rod 24

As a first step, a single crystal manufacturing condition when pulling the silicon single crystal rod 24 by the silicon single crystal pulling apparatus 10 is first arbitrarily defined. This single crystal manufacturing condition is a group of parameters $P_1, P_2, \ldots, P_N$ obtained by changing a variable which is fed back to a later-described hot zone of the pulling apparatus 10 at fixed intervals when pulling the silicon single crystal 11 by the pulling apparatus 10. Further, as the single crystal manufacturing condition, there are included a pulling speed of the silicon single crystal rod 24, a revolving speed of the silicon single crystal rod 24, a revolving speed of the quartz crucible 15, a flow quantity of an argon gas, a shape and a material of a member constituting a heat cap, a gap between a lower end of the heat cap and a surface of the silicon melt 13, a heater output and others.

As a second step, respective members in the hot zone of the pulling apparatus 10 in a state where the silicon single crystal rod 24 is pulled to a predetermined length $L_1$ (e.g., 100 mm), i.e., the chamber, the quartz crucible 15, the silicon melt 13, the silicon single crystal rod 24, the black lead susceptor, the heat reserving cover and others are subjected to mesh division and modeling. Specifically, coordinate data of mesh points of the respective members in the hot zone is input to the computer. At this time, in the mesh of the silicon melt 13, the mesh in the radial direction of the silicon single crystal rod 24 which is also the mesh of all or part of the silicon melt 13 immediately below the silicon single crystal rod 24 (which will be referred to as a radial mesh hereinafter) is set to 0.01 to 5.00 mm, or preferably, 0.25 to 1.00 mm. Furthermore, in the mesh of the silicon melt 13, the mesh in the longitudinal direction of the silicon single crystal rod 24 which is also the mesh of all or part of the silicon melt 13 (which will be referred to as a longitudinal mesh hereinafter) is set to 0.01 to 5.00 mm, or preferably, 0.1 to 0.5 mm.

The radial mesh is restricted to the range of 0.01 to 5.00 mm because a calculation time becomes very long when this mesh is less than 0.01 mm, whilst the calculation becomes unstable and a solid-fluid interface shape cannot be certainly determined even if the calculation is repeatedly effected when this mesh exceeds 5.00 mm. Moreover, the longitudinal mesh is restricted to the range of 0.01 mm to 5.00 mm because a calculation time becomes very long when this mesh is less than 0.01 mm, and a calculation value of the solid-fluid interface shape does not match with a measured value when this mesh exceeds 5.00 mm. Incidentally, when a part of the radial mesh is restricted to a range of 0.01 to 5.0, it is preferable to restrict the silicon melt 13 in the vicinity of the outer rim of the silicon single crystal rod 24 in the silicon melt 13 immediately below the silicon single crystal rod 24 to the above-described range. When a part of the longitudinal mesh is restricted to the range of 0.01 to 5.00, it is preferable to restrict the part of the silicon melt 13 in the vicinity of the liquid level and in the vicinity of the bottom to the above-described range.

As a third step, the meshes are gathered up in accordance with each member in the hot zone, and physical properties of each member are input to the computer with respect to this gathered mesh. For example, when the chamber is formed of stainless steel, a thermal conductivity, an emissivity, a viscosity coefficient, a cubical expansion coefficient, a density and a specific heat of the stainless steel are input to the computer. Additionally, a pulling length of the silicon single crystal rod 24, a pulling speed of the silicon single crystal rod 24 associated with this pulling length, and a turbulence parameter C in a later-described turbulence model expression (1) are input to the computer.

As a fourth step, a surface temperature distribution of each member in the hot zone is obtained by a calculation using the computer based on a calorific value of the heater and an emissivity of each member. That is, a calorific value of the heater is arbitrarily set and input to the computer, and a surface temperature distribution of each member is acquired by a calculation using the computer based on an emissivity of each member. Then, as a fifth step, an internal temperature distribution of each member is obtained by a calculation solving a heat conduction equation (1) based on the surface temperature distribution and the thermal conductivity of each member in the hot zone. In this example, although an xyz rectangular coordinate system is used in order to simplify the description, a cylindrical coordinate system is used in the actual calculation.

$$\rho c \frac{\partial T}{\partial t} = \frac{\partial}{\partial t}\left(\lambda_x \frac{\partial T}{\partial x}\right) + \frac{\partial}{\partial y}\left(\lambda_y \frac{\partial T}{\partial y}\right) + \frac{\partial}{\partial z}\left(\lambda_z \frac{\partial T}{\partial z}\right) + q \quad (1)$$

where $\rho$ is a density of each member, c is a specific heat of each member, T is an absolute temperature at each mesh point of each member, t is a time, $\lambda_x$, $\lambda_y$ and $\lambda_z$ are components in x, y and z directions of a thermal conductivity of each member, and q is a calorific value of the heater.

On the other hand, in regard to the silicon melt 13, the internal temperature distribution of the silicon melt 13 is obtained based on the heat conduction equation (1), and then a turbulence model expression (2) obtained based on the internal temperature distribution of the silicon melt 13 on the assumption that the silicon melt 13 has a turbulent flow is coupled with Navier-Stokes' equations (3) to (5), thereby obtaining an internal flow rate distribution of the silicon melt 13 by using the computer.

$$\kappa_t = \frac{c}{Pr_t} \times \rho \times C \times d\sqrt{k} \quad (2)$$

where $\kappa_t$ is a turbulence thermal conductivity of the silicon melt 13, c is a specific heat of the silicon melt 13, $Pr_t$ is a Prandtl number, $\rho$ is a density of the silicon melt 13, C is a turbulence parameter, d is a distance from a wall of the quartz crucible 15 in which the silicon melt 13 is stored, and k is a square sum of a fluctuation component with respect to an average flow rate of the silicon melt 13.

$$\frac{\partial u}{\partial t} + u\frac{\partial u}{\partial x} + v\frac{\partial u}{\partial y} + w\frac{\partial u}{\partial z} = \quad (3)$$
$$-\frac{1}{\rho}\frac{\partial p}{\partial x} + (v_1 + v_t)\left(\frac{\partial^2 u}{\partial x^2} + \frac{\partial^2 u}{\partial y^2} + \frac{\partial^2 u}{\partial z^2}\right) + \frac{F_x}{\rho}$$

$$\frac{\partial v}{\partial t} + u\frac{\partial v}{\partial x} + v\frac{\partial v}{\partial y} + w\frac{\partial v}{\partial z} = \quad (4)$$
$$-\frac{1}{\rho}\frac{\partial p}{\partial y} + (v_1 + v_t)\left(\frac{\partial^2 v}{\partial x^2} + \frac{\partial^2 v}{\partial y^2} + \frac{\partial^2 v}{\partial z^2}\right) + \frac{F_y}{\rho}$$

$$\frac{\partial w}{\partial t} + u\frac{\partial w}{\partial x} + v\frac{\partial w}{\partial y} + w\frac{\partial w}{\partial z} = \quad (5)$$
$$-\frac{1}{\rho}\frac{\partial p}{\partial z} + (v_1 + v_t)\left(\frac{\partial^2 w}{\partial x^2} + \frac{\partial^2 w}{\partial y^2} + \frac{\partial^2 w}{\partial z^2}\right) + \frac{F_z}{\rho}$$

where u, v and w are components in x, y and z directions of a flow rate at each mesh point of the silicon melt 13, $v_1$ is a molecular dynamic viscosity (a physical property) of the silicon melt 13, $v_t$ is a dynamic viscosity obtained by an effect of a turbulence of the silicon melt 13, and $F_x$, $F_y$ and $F_z$ are components in x, y and z directions of a body force which acts on the silicon melt 13.

The above-described turbulence model expression (2) is called a kl-model expression, and it is preferable to use an arbitrary value in a range of 0.4 to 0.6 as the turbulence parameter C in this model expression. The turbulence parameter C is restricted to the range of 0.4 to 0.6 because there is an inconvenience that an interface shape obtained by the calculation does not match with a measured value when this parameter is less than 0.4 or exceeds 0.6. Furthermore, the Navier-Stokes' equations (3) to (5) are equations of motion when the silicon melt 13 is a fluid which has the incompressibility and a fixed viscosity.

An internal temperature distribution of the silicon melt 13 taking a convection of the silicon melt 13 into consideration is further obtained by using the computer solving a thermal energy equation (6) based on the acquired internal flow rate distribution of the silicon melt 13.

$$u\frac{\partial T}{\partial x} + v\frac{\partial T}{\partial y} + w\frac{\partial T}{\partial z} = \frac{1}{\rho c}(\kappa_1 + \kappa_t)\left(\frac{\partial^2 T}{\partial x^2} + \frac{\partial^2 T}{\partial y^2} + \frac{\partial^2 T}{\partial z^2}\right) \quad (6)$$

where u, v and w are components in x, y and z directions of a flow rate at each mesh point of the silicon melt 13, T is an absolute temperature at each mesh point of the silicon melt 13, $\rho$ is a density of the silicon melt 13, c is a specific heat of the silicon melt 13, $\kappa_1$ is a molecular thermal conductivity (a physical property), and $\kappa_t$ is a turbulence thermal conductivity calculated by using the expression (1).

Figure 6:
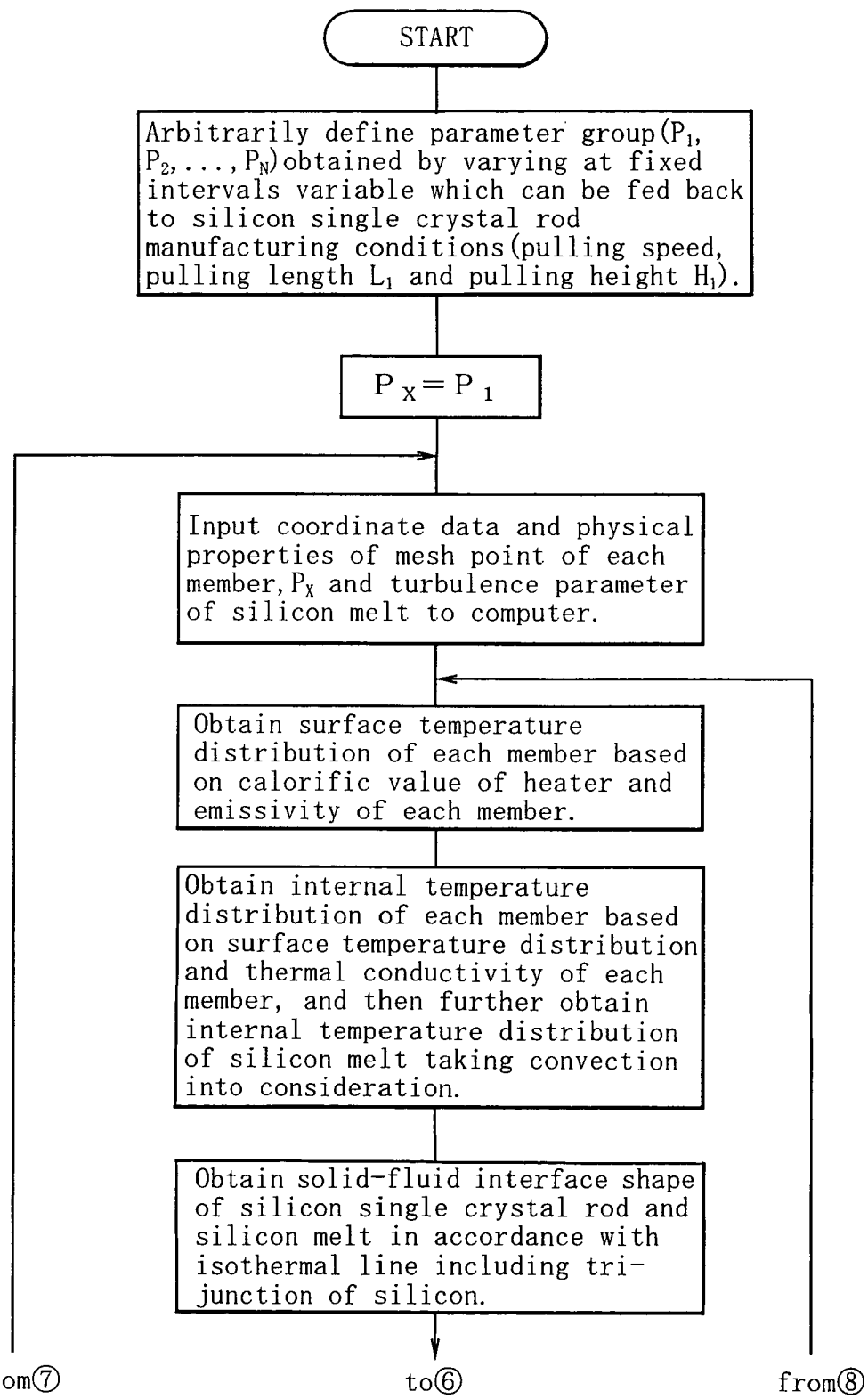
FIG. 6 is a flowchart showing a first stage of a defect simulation method for the silicon single crystal rod.

Then, as a sixth step, a solid-fluid interface shape of the silicon single crystal rod 24 and the silicon melt 13 is obtained by a calculation using the computer in accordance with an isothermal line including a tri-junction S (a tri-junction of a solid, a liquid and a gas) of silicon indicated by a point S in FIG. 6. As a seventh step, a calorific value of the heater which is input to the computer is changed (gradually increased), the fourth step to the sixth step are repeated until the tri-junction S reaches a melting point of the silicon single crystal rod 24, then a temperature distribution in the pulling apparatus 10 is calculated in order to obtain a coordinate and a temperature of the mesh of the silicon single crystal, and these data are stored in the computer.

Then, as an eighth step, δ (e.g., 50 mm) is added to the pulling length $L_1$ of the silicon single crystal rod 24, the second step to the seventh step are repeated, then a coordinate and a temperature of the mesh of the silicon single crystal rod 24 are obtained by calculating a temperature distribution in the pulling apparatus 10, and these data are stored in the computer. This eighth step is performed until the pulling length $L_1$ of the silicon single crystal rod 24 reaches a length $L_2$ ($L_2$ is a length of the silicon single crystal rod 24 when separated from the silicon melt 13 (a crystal length when the growth is completed)), the silicon single crystal rod 24 is separated from the silicon melt 13, then the silicon single crystal rod 24 is pulled and its height $H_1$ ($H_1$ is a distance from a trunk start portion of the silicon single crystal rod 24 to a liquid level of the silicon melt 13 (FIG. 6)) reaches $H_2$ ($H_2$ is a distance from the trunk start portion of the silicon single crystal rod 24 to the liquid level of the silicon melt 13 when cooling is completed), i.e., until cooling of the silicon single crystal rod 24 is completed. It is to be noted that, after the silicon single crystal rod 24 is separated from the silicon melt 13, δ (e.g., 50 mm) is added to the pulling height $H_1$ of the silicon single crystal rod 24, and the second step to the seventh step are repeated like the above.

When the pulling height $H_1$ of the silicon single crystal rod 24 reaches $H_2$, the processing advances to a ninth step. At the ninth step, a time from $t_0$ where the silicon single crystal rod 24 is grown from the silicon melt 13 and pulling is started to $t_1$ where the silicon single crystal rod 24 is separated from the silicon melt 13, the silicon single crystal rod 24 is pulled and cooling is completed is divided at predetermined intervals of $\Delta t$ seconds (small time intervals). In this example, constants used in the expression which is used to obtain concentration distributions and size distributions of a void and a high-temperature oxygen precipitate which will be described later as well as diffusion coefficients and boundary conditions of the interstitial silicon and vacancies in the silicon single crystal rod 24 are respectively input to the computer. The pulling length $L_1$ and the pulling height $H_1$ of the silicon single crystal rod 24 and the temperature distribution in the silicon single crystal rod 24 are obtained by the calculation from data of the coordinate and the temperature of the mesh of the silicon single crystal rod 24 acquired at the eighth step at divided time intervals of $\Delta t$ seconds.

That is, the coordinate and the temperature of the mesh of the silicon single crystal are obtained in accordance with each pulling length $\delta$ at the second to eighth steps. Since several-ten minutes are required to pull the silicon single crystal by, e.g., 50 mm, a change in temperature of the mesh of the silicon single crystal in the several-ten seconds is differentiated as a function of the time, thereby calculating the pulling length $L_1$ and the pulling height $H_1$ of the silicon single crystal rod 24 and the temperature distribution in the silicon single crystal rod 24 after $\Delta t$ seconds from the time $t_0$. Then, concentration distributions of the vacancies and the interstitial silicon after $\Delta t$ seconds are obtained by the calculation solving the diffusion equation based on the diffusion coefficients and the boundary conditions of the vacancies and the interstitial silicon in the silicon single crystal rod 24 (a 10th step).

Specifically, a computational expression of a concentration $C_v$ of the vacancies is represented by the following expression (7), and a computational expression of a concentration $C_i$ of the interstitial silicon is represented by the following expression (8). In the expressions (7) and (8), it is assumed that a thermal equilibrium of each of the vacancies and the interstitial silicon is maintained on the entire surface of the silicon single crystal in order to calculate a progress with time of each of the concentration $C_v$ and the concentration $C_i$.

$$C_v^e = K_1 \exp\left(-\frac{E_v}{kT}\right) \quad (7)$$

$$C_i^e = K_2 \exp\left(-\frac{E_i}{kT}\right) \quad (8)$$

where $K_1$ and $K_2$ are constants, $E_i$ and $E_v$ are formation energies of the interstitial silicon and the vacancies, a superscript character e in $C_v^e$ and $C_i^e$ is an equilibrium quantity, k is a Boltzmann constant, and T is an absolute temperature.

The above-described equilibrium expression is differentiated by time to be turned into the following expressions (9) and (10) for the vacancies and the interstitial silicon, respectively.

$$\frac{dC_v}{dt} = -\nabla(D_v \nabla C_v) + \nabla\left(\frac{E_v^t}{k_B T^2} D_v C_v \nabla T\right) + \\ \Theta(T - T_n) k_{iv}(T)(C_i C_v - C_i^e(T) C_v^e(T)) - \\ \Theta(T_{v0} - T) N_{v0} \times 4\pi r_{v0} D_v (C_v - C_v^e) - \Theta(T_p - T) N_p \times 4\pi R_p \gamma D_0 D_0 \quad (9)$$

$$\frac{dC_i}{dt} = -\nabla(D_i \nabla C_i) + \nabla\left(\frac{E_v^t}{k_B T^2} D_i C_i \nabla T\right) + \\ \Theta(T - T_n) k_{iv}(T)(C_i C_v - C_i^e(T) C_v^e(T)) - \\ \Theta(T_{v0} - T) N_{v0} \times 4\pi r_{v0} D_i (C_i - C_i^e) \quad (10)$$

where $\Theta(x)$ is a Heaviside function. That is, $\Theta(x)=0$ when $x<0$, and $\Theta(x)=1$ when $x>0$. Further, $T_n$ is a higher temperature when a formation start temperature $T_p$ of the high-temperature oxygen precipitate is compared with a formation start temperature $T_{v0}$ of the void. Furthermore, the first term on the right-hand side in each of the expressions (9) and (10) is a Fick's diffusion equation, and $D_v$ and $D_i$ in the first term on the right-hand side are diffusion coefficients represented by the following expressions (11) and (12).

$$D_v = d_v \exp\left(-\frac{\Delta E_v}{kT}\right) \quad (11)$$

$$D_i = d_i \exp\left(-\frac{\Delta E_i}{kT}\right) \quad (12)$$

where $\Delta E_v$ and $\Delta E_i$ are respective activation energies of the vacancies and the interstitial silicon, and $d_v$ and $d_i$ are respective constants. Moreover, $E_v^t$ and $E_i^t$ in the second terms on the right-hand side of the expressions (9) and (10) are activation energies of the vacancies and the interstitial silicon obtained by thermal diffusion, and $k_B$ is a Boltzmann constant. $k_{iv}$ in the third term on the right-hand side of each of the expressions (9) and (10) is a recombination constant of a pair of the vacancies and the interstitial silicon. $N_{v0}$ in the fourth term on the right-hand side in each of the expressions (9) and (10) is a concentration of the void, $r_{v0}$ is a radius of the void, $N_p$ in the fifth term on the right-hand side of the expression (9) is a concentration of the high-temperature oxygen precipitate, $R_p$ is a radius of the high-temperature oxygen precipitate, and $\gamma$ is a vacancy consumption per oxygen atom required for an $SiO_2$ precipitate to be separated out without being distorted.

On the other hand, the expression (9) is achieved when a flow rate required for the vacancies to be separated out is sufficiently high and a difference in cubic content per unit mass between an Si matrix and an $SiO_2$ matrix can be eliminated, i.e., when $D_v(C_v - C_v^e) \geq \gamma D_0 C_0$ is attained. In any other case, the following expression (13) can be achieved.

$$\frac{dC_V}{dt} = -\nabla(D_V \nabla C_V) + \nabla\left(\frac{E_v^t}{k_B T^2} D_V C_V \nabla T\right) + \\ \Theta(T - T_n) k_{iv}(T)(C_i C_v - C_i^e(T) C_v^e(T)) - \\ \Theta(T_{v0} - T) N_{v0} \times 4\pi r_{v0} D_V (C_V - C_V^e) - N_p \times 4\pi R_p D_V (C_V - C_V^e) \quad (13)$$

Then, as an 11th step, a void formation start temperature $T_{V0}$ is obtained from the following expression (14) based on the concentration $C_V$ distribution of the vacancies acquired by solving the diffusion equation (13).

$$T_{VO}^{1.5}\left[k_B^{1.5}\log_e\left(\frac{C_{Vm}}{C_V}\right) - k_B^{0.5}\frac{E_V}{T_m}\right] + T_{VO}^{0.5}k_B^{0.5}E_V = \frac{0.68\sigma_V^{1.5}}{\rho} \quad (14)$$

where $C_{Vm}$ is a vacancy equilibrium concentration at a melting point $T_m$ of the silicon melt, $E_V$ is a vacancy formation energy, $T_m$ is a melting temperature of the silicon single crystal rod 24. Moreover, $\sigma_V$ is an interface energy on a crystal face (111) of the silicon single crystal rod 24, $\rho$ is a density of the silicon single crystal rod 24, and $k_B$ is a Boltzmann constant.

A 12th step will be described later, and a 13th step will now be explained. At the 13th step, when a temperature at a lattice point of each mesh in the silicon single crystal rod 24 is gradually lowered and reaches the void formation start temperature $T_{VO}$, a concentration $N_{VO}$ of the void is obtained by using the following approximate expression (15).

$$N_{VO} \approx a_1\left(\frac{dT}{dt}\right)^{1.5}(D_V k_B T^2)^{-1.5}(C_V)^{-0.5} \quad (15)$$

Additionally, as a 14th step, a radius $r_{VO}$ of the void when a temperature at a lattice point of each mesh in the silicon single crystal rod 24 is lower than the void formation start temperature $T_{VO}$ is obtained from the following expression (16).

$$r_{VO} = \left[\frac{2}{\rho}\int_{t1}^{t}\{D_v(C_V - C_V^e) - D_i(C_i - C_i^e)\}dt + r_{cr}^2\right]^{0.5} \quad (16)$$

where $t_1$ is a time when a temperature at a lattice point of each mesh in the silicon single crystal rod 24 is lowered to the void formation start temperature $T_{VO}$, and $r_{cr}$ is a critical radius of the void. The ninth to 11th steps, the 13th step and the 14th step are repeated until the silicon single crystal rod 24 is cooled to a specific value between 800 to 1000° C., e.g., 900° C. or below (a 17th step). It is to be noted that the expressions (9) to (16) are coupled and solved by the computer. Additionally, the 15th and 16th steps will be described later.

[2] Concentration Distribution and Size Distribution of High-Temperature Oxygen Precipitate in Silicon Single Crystal Rod 24

Returning to the 12th step, a high-temperature oxygen precipitate formation start temperature $T_p$ is obtained by the calculation from the following expression (17) based on the concentration $C_V$ distribution of the vacancies acquired by solving the diffusion equations (9) and (10).

$$T_p^{1.5}\left[k_B^{1.5}\log_e\left\{\left(\frac{C_0}{C_{0m}}\right)\left(\frac{C_V}{C_{Vm}}\right)^\gamma\right\} - \frac{k_B^{0.5}(E_0 + \gamma E_V)}{T_m}\right] +$$
$$T_p^{0.5}k_B^{0.5}(E_0 + \gamma E_v) = \frac{0.6\sigma_p^{1.5}}{\rho} \quad (17)$$

where $C_0$ is an oxygen concentration, $C_0m$ is an oxygen equilibrium concentration at the melting point $T_m$ of the silicon melt 13, and $E_0$ is an oxygen dissolving energy. Further, $E_v$ is a vacancy formation energy, and $\sigma_p$ is an interface energy of Si and SiO$_2$ in the silicon single crystal rod 24. Furthermore, $\gamma$ is a vacancy consumption per oxygen atom required for an SiO$_2$ precipitate to be separated out without being distorted, and its value is 0.68.

Subsequently, as a 15th step, when a temperature at a lattice point of each mesh in the silicon single crystal rod 24 is gradually lowered and reaches the high-temperature oxygen precipitate formation start temperature $T_p$, a concentration $N_p$ of the high-temperature oxygen precipitate is obtained by using the following approximate expression (18). It is to be noted that a$_2$ is a constant in the expression (18).

$$N_p \approx a_2\left(\frac{dT}{dt}\right)^{1.5} C_V(D_0 C_0 k_B T^2)^{-1.5} \quad (18)$$

Moreover, as a 16th step, a radius $R_p$ of the high-temperature oxygen precipitate when a temperature at a lattice point of each mesh in the silicon single crystal rod 24 is lower than the high-temperature oxygen precipitate formation start temperature $T_p$ is obtained from the following expression (19).

$$R_p = \left[\frac{\eta}{\rho}C_0\int_{t2}^{t}D_0 dt + R_{cr}^2\right]^{0.5} \quad (19)$$

where $t_2$ is a time when a temperature at a lattice point of each mesh in the silicon single crystal rod 24 is lowered to the high-temperature oxygen precipitate formation start temperature $T_p$, and $R_{cr}$ is a critical radius of the high-temperature oxygen precipitate.

On the other hand, the expression (19) is achieved when a flow rate required for the vacancy to be separated out and a difference in cubic content per unit mass between an Si matrix and SiO$_2$ can be eliminated, i.e., when $D_v(C_V-C_v^e) \geq \gamma D_0 C_0$ is attained. In any other case, the following expression (20) can be achieved.

$$R_p = \left[\frac{\eta}{\gamma\rho}\int_{t2}^{t}D_v(C_v - C_v^e)dt + R_{cr}^2\right]^{0.5} \quad (20)$$

The ninth, 10th, 12th, 15th and 16th steps are repeated until the silicon single crystal rod 24 is cooled down to a specific value between 800 to 1000° C., e.g., 900° C. or below (the 17th step). It is to be noted that the expressions (9) to (13) and the expressions (17) to (20) are coupled and solved by the computer.

Figure 7:
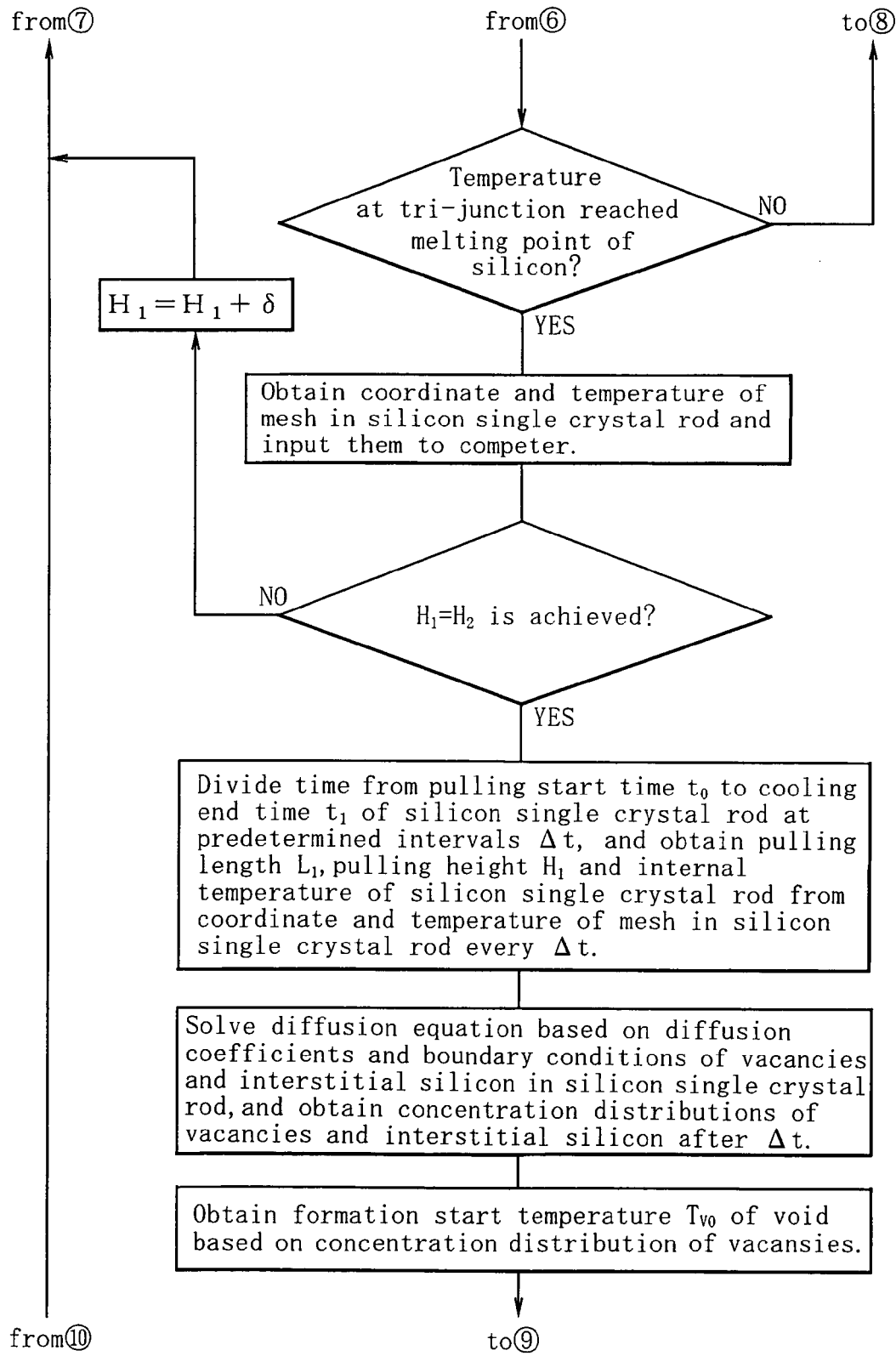
FIG. 7 is a flowchart showing a second stage of the defect simulation method for the silicon single crystal rod.
Figure 8:
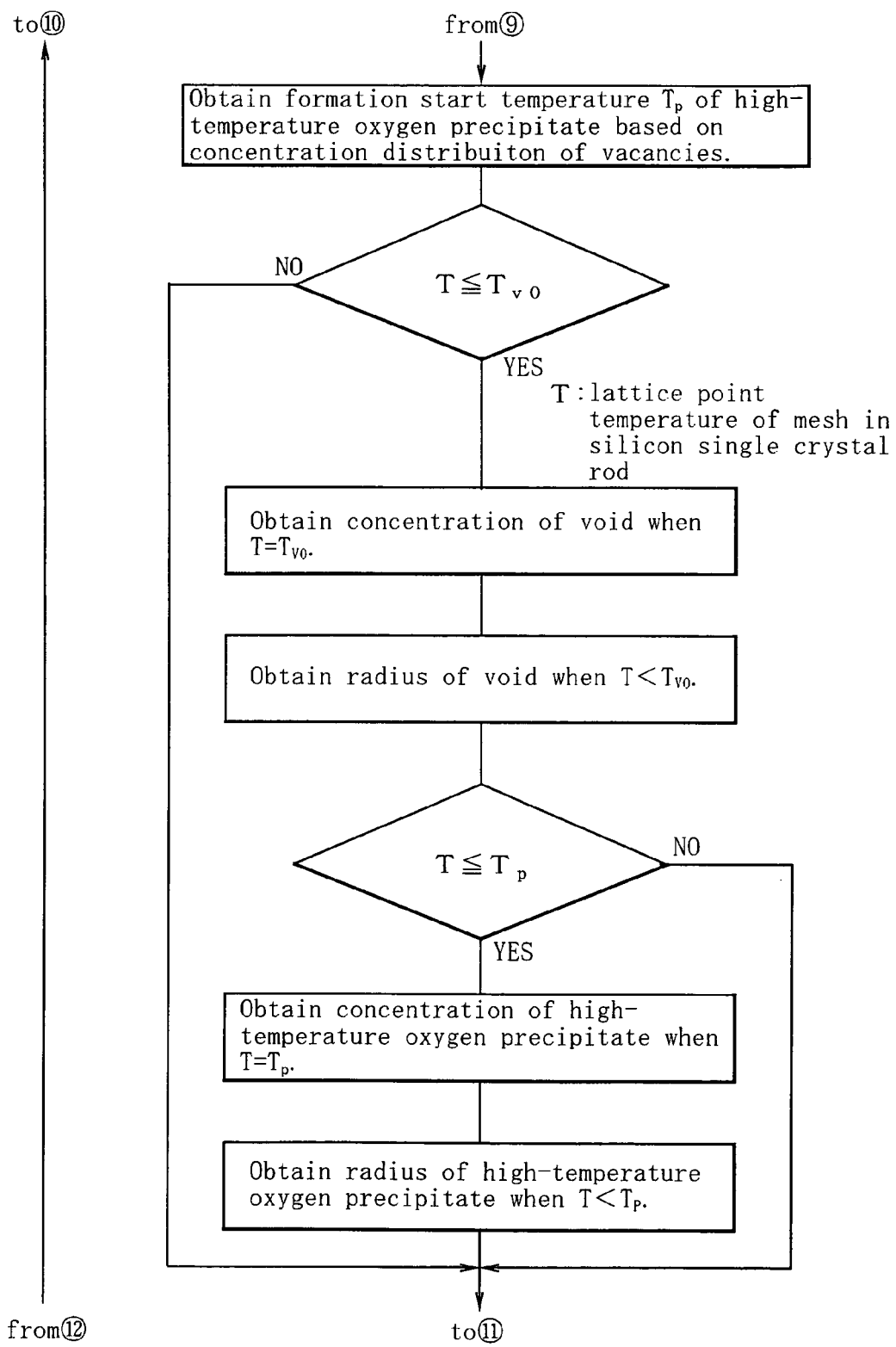
FIG. 8 is a flowchart showing a third stage of the defect simulation method for the silicon single crystal rod.
Figure 9:
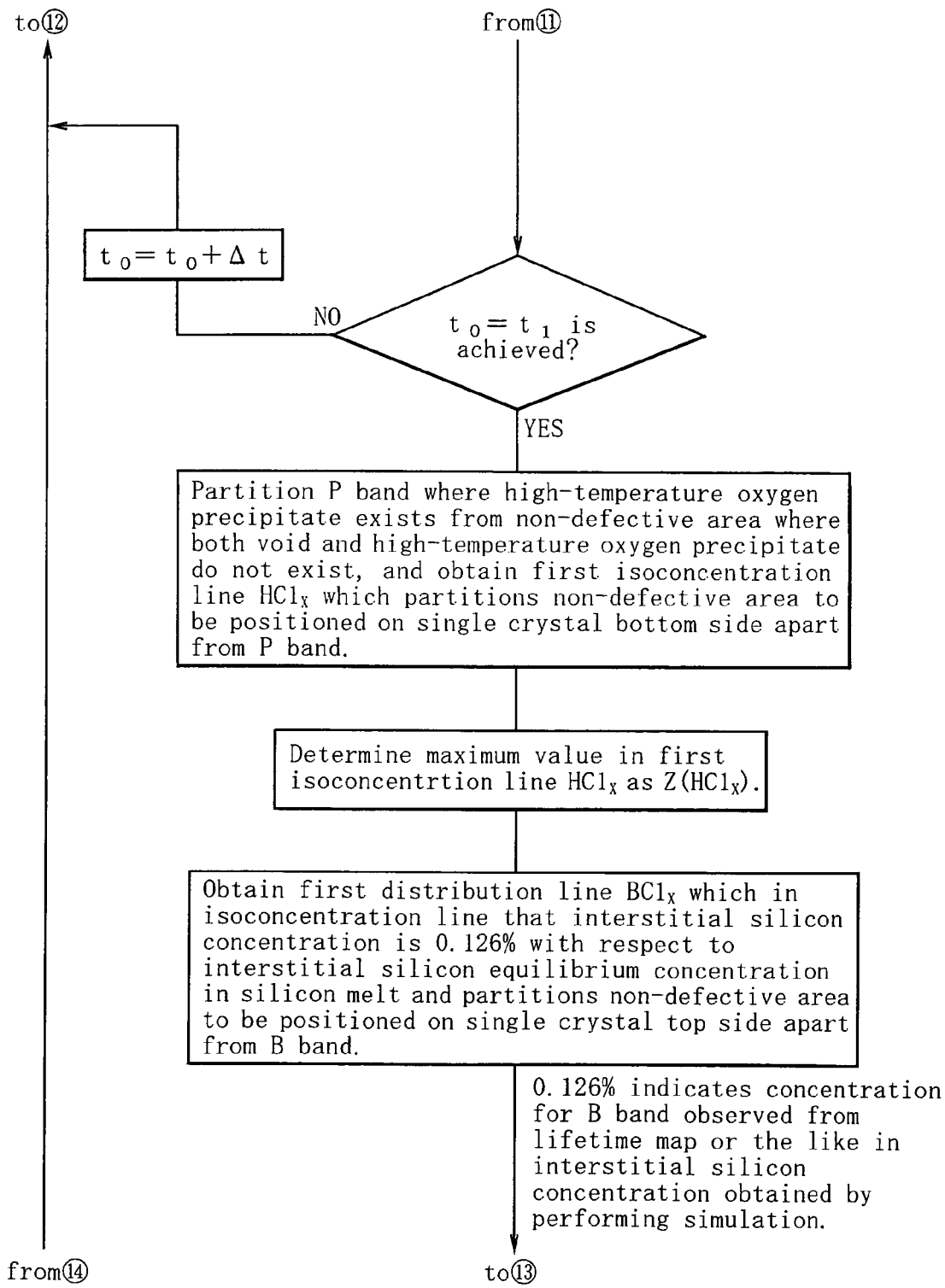
FIG. 9 is a flowchart showing a fourth stage of the defect simulation method for the silicon single crystal rod.
Figure 10:
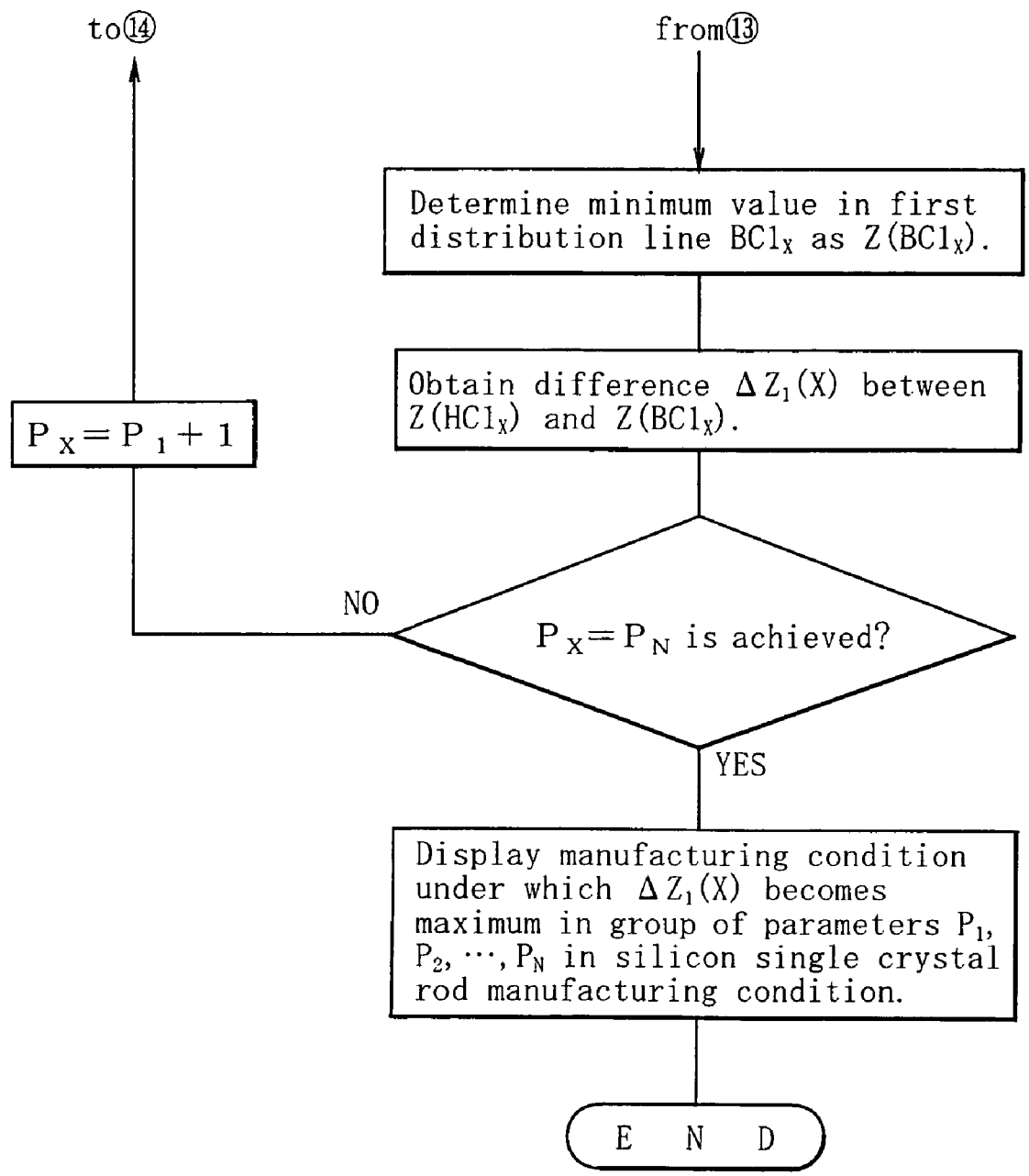
FIG. 10 is a flowchart showing a fifth stage of the defect simulation method for the silicon single crystal rod.

As an 18th step, a first isoconcentration line HC1$_x$ which partitions a P band in which the high-temperature oxygen precipitate exists from a non-defective area in which both the void and the high-temperature oxygen precipitate do not exist and partitions the non-defective area to be positioned on a single crystal bottom side apart from the P band is obtained by the calculation (FIG. 7). Then, as a 19th step, a first distribution line BC1$_X$ which partitions a B band where the high-temperature oxygen precipitate exists from the non-defective area and partitions the non-defective area to be positioned on the single crystal top side apart from the B band is obtained by the calculation. The first distribution line is an isoconcentration line that an interstitial silicon concentration has a specific value falling within a range of 0.12 to 0.13%, e.g., 0.126% with respect to an equilibrium concentration of the interstitial silicon at the silicon melting point. In this example, a specific value of the interstitial silicon concentration falling in the range of 0.12 to 0.13%, e.g., 0.126% is a concentration for the B band which can be observed from a map or the like of a lifetime in the interstitial silicon concentration acquired by performing the simulation. Moreover, the B band means an area where an aggregate of the interstitial silicon serves as a nucleus and the oxygen precipitate is generated at a high concentration due to a heat treatment.

Then, as a 20th step, a difference $\Delta Z_1(X)$ between a maximum value of an inflection point of the first isoconcentration line $HC1_X$ and a minimum value of an inflection point of the first distribution line $BC_1X$ is obtained. When, e.g., three inflection points of the first isoconcentration line $HC1_X$ exist, assuming that coordinates of the respective inflection points $Q1(1, X)$, $Q1(2, X)$ and $Q1(3, X)$ are $(r_{Q1}(1, X), z_{Q1}(1, X))$, $(r_{Q1}(2, X), z_{Q1}(2, X))$ and $(r_{Q1}(3, X), z_{Q1}(3, X))$, the maximum value $z_{Q1}(1, X)$ in the z coordinates $z_{Q1}(1, X)$, $z_{Q1}(2, X)$ and $z_{Q1}(3, X)$ in these coordinates is obtained. Additionally, when there are, e.g., five inflection points of the first distribution line $BC1_X$, assuming that coordinates of the respective inflection points $S1(1, X)$, $S1(2, X)$, $S1(3, X)$, $S1(4, X)$ and $S1(5, X)$ are $(r_{S1}(1, X), z_{S1}(1, X))$, $(r_{S1}(2, X), z_{S1}(2, X))$, $(r_{S1}(3, X), z_{S1}(3, X))$, $(r_{S1}(4, X), z_{S1}(4, X))$ and $(r_{S1}(5, X), z_{S1}(5, X))$, the minimum value $z_{S1}(3, X)$ in the z coordinates $z_{S1}(1, X)$, $z_{S1}(2, X)$, $z_{S1}(3, X)$, $z_{S1}(4, X)$ and $Z_{S1}(5, X)$ in these coordinates is obtained. Then, a difference $\Delta Z_1(X)$ between the maximum value $z_{Q1}(1, X)$ of the inflection point of the first isoconcentration line $HC1_X$ and the minimum value $z_{S1}(3, X)$ of the inflection point of the first distribution line $BC1_X$ is obtained.

As a 21st step, the parameter in the single crystal manufacturing condition is changed to $P_2$, the second step to the 20th step are executed. Then, the parameter in the single crystal manufacturing condition is changed to $P_3$, and the second step to the 20th step are carried out. The second step to the 20th step are repeated until the parameter in the single crystal manufacturing condition becomes $P_N$. Thereafter, a difference $\Delta Z_1(X)$ between the maximum value of the inflection point of the first isoconcentration line $HC1_X$ and the minimum value of the inflection point of the first distribution line $BC1_X$ is obtained, and the single crystal manufacturing condition under which this difference $\Delta Z_1(X)$ becomes maximum is acquired by the calculation.

It is to be noted that the quality prediction calculation for the silicon single crystal rod 24 and the corrected pulling speed calculation may be effected by the following method. First to 17 steps are the same as the first to 17 steps in the above-described defect simulation method.

Figure 12:
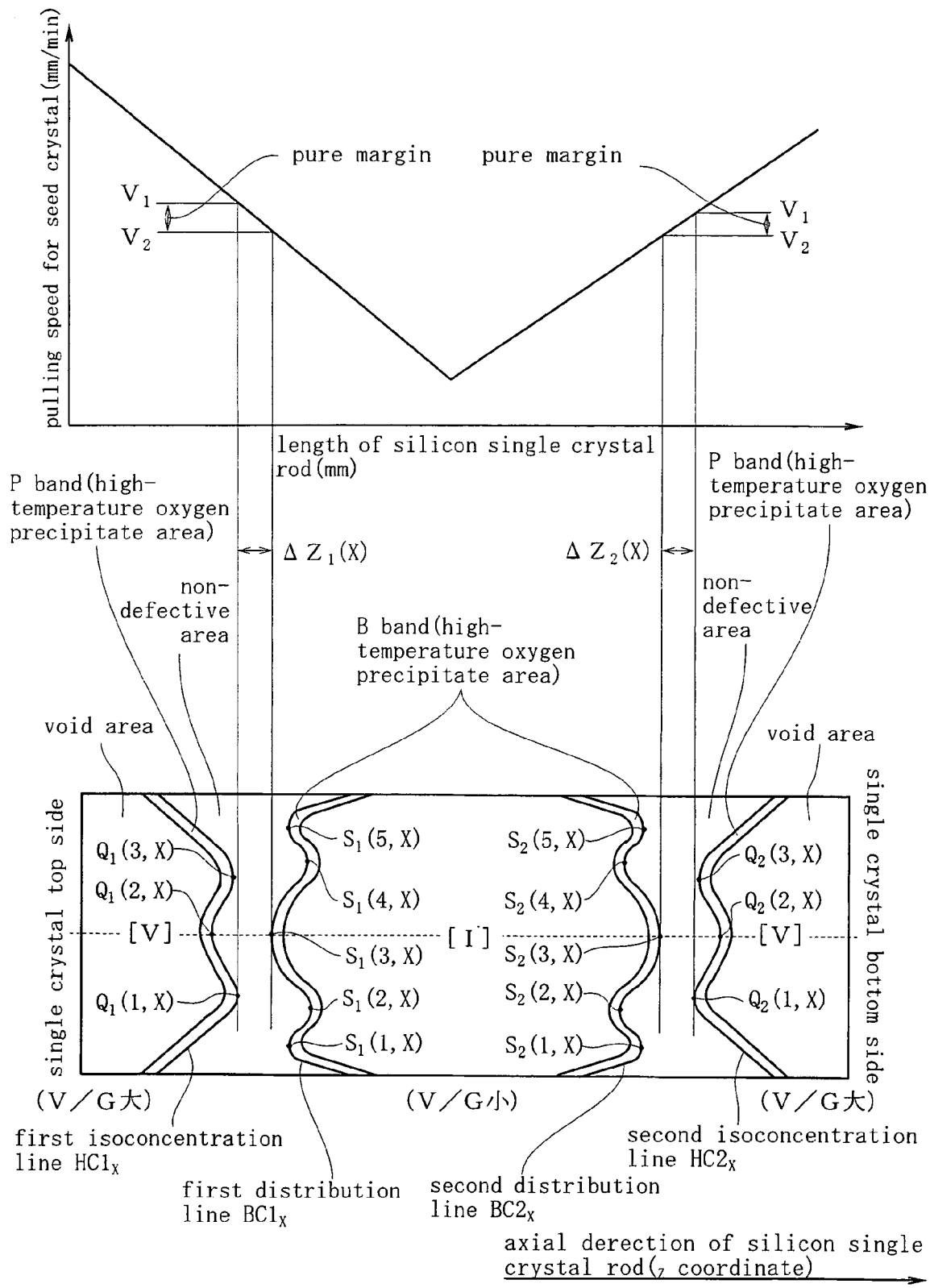
FIG. 12 is an explanatory view showing a distribution of interstitial silicon and vacancies in the silicon single crystal when a pulling speed for the silicon single crystal is changed.

At an 18th step, a second isoconcentration line $HC2_X$ which partitions a P band where the high-temperature oxygen precipitate exists from a non-defective area where both the void and the high-temperature oxygen precipitate do not exist and partitions the non-defective area to be placed on the single crystal top side apart from the P band is obtained by the calculation (FIG. 12). Then, at a 19th step, a second distribution line $BC2_X$ which partitions a B band where the high-temperature oxygen precipitate exists from the non-defective area where both the void and the high-temperature oxygen precipitate do not exist and partitions the non-defective area to be placed on the single crystal bottom side apart from the B band is obtained by the calculation. The second distribution line means an isoconcentration line that an interstitial silicon concentration has a specific value falling in a range of 0.12 to 0.13%, e.g., 0.126% with respect to an equilibrium concentration of the interstitial silicon at the silicon melting point. In this example, a specific value falling in the range of 0.12 to 0.13%, e.g., 0.126% of the interstitial silicon concentration means a concentration for the B band which is observed from a map or the like of a lifetime in the interstitial silicon concentration obtained by performing the simulation.

Then, at a 20th step, a difference $\Delta Z_2(X)$ between the minimum value of the inflection point of the second isoconcentration line $HC2_X$ and the maximum value of the inflection point of the second distribution line $BC2_X$ is obtained. When there are, e.g., three inflection points of the second isoconcentration line $HC2_X$, assuming that coordinates of the respective inflection points $Q2(1, X)$, $Q2(2, X)$ and $Q2(3, X)$ are $(r_{Q2}(1, X), z_{Q2}(1, X))$, $(r_{Q2}(2, X), z_{Q2}(2, X))$ and $(r_{Q2}(3, X)$ and $z_{Q2}(3, X))$, the minimum value $z_{Q2}(1, X)$ in the z coordinates $z_{Q2}(1, X)$, $z_{Q2}(2, X)$ and $z_{Q2}(3, X)$ in these coordinates is obtained. Further, when there are, e.g., five inflection points of the second distribution line $BC2_X$, assuming that coordinates of the respective inflection points $S2(1, X)$, $S2(2, X)$, $S2(3, X)$, $S2(4, X)$ and $S2(5, X)$ are $(r_{S2}(1, X), z_{S2}(1, X))$, $(r_{S2}(2, X), z_{S2}(2, X))$, $(r_{S2}(3, X), z_{S2}(3, X))$, $(r_{S2}(4, X), z_{S2}(4, X))$ and $(r_{S2}(5, X), z_{S2}(5, X))$, the maximum value $z_{S2}(3, X)$ in the z coordinates $z_{S2}(1, X)$, $z_{S2}(2, X)$, $z_{S2}(3, X)$, $z_{S2}(4, X)$ and $z_{S2}(5, X)$ in these coordinates is obtained. Then, a difference $\Delta Z_2(X)$ between the minimum value $z_{Q2}(1, X)$ of the inflection point of the second isoconcentration line $HC2_X$ and the maximum value $z_{S2}(3, X)$ of the inflection point of the second distribution line $BC2_X$ is obtained.

At a 21st step, the parameter in the condition for manufacturing the silicon single crystal rod 24 is changed to $P_2$, and the second step to the 20th step are executed. Then, the parameter in the condition for manufacturing the silicon single crystal rod 24 is changed to $P_3$, and the second step to 20th step are executed. That is, the second step to the 20th step are repeated until the parameter in the condition for manufacturing the silicon single crystal rod 24 becomes $P_N$. Thereafter, the difference $\Delta Z_2(X)$ between the minimum value of the inflection point of the second isoconcentration line $HC2_X$ and the maximum value of the inflection point of the second distribution line $BC2_X$ is obtained, and the condition for manufacturing the silicon single crystal rod 24 under which this difference $\Delta Z_2(X)$ becomes maximum is acquired by the calculation.

The embodiments according to the present invention as well as comparative examples will now be described in detail.

<Embodiment1>

A silicon single crystal rod having a predetermined diameter was pulled while controlling a pulling speed based on the expression (A).

COMPARATIVE EXAMPLE 1

A silicon single crystal rod having a predetermined diameter was pulled based on the expression (C). In this example, the PIT constant was set for a portion following the top portion.

$$V_n = Vs + \\ P[d_n + I\Sigma\{(d_{n-1} + d_n)/2\} \times \Delta t + D\{(d_n - d_{n-1})/\Delta t\} \times \exp(-t/T)] \quad (C)$$

where symbols in the expression (C) equal to those in the expression (A) indicate the same terms.

COMPARATIVE EXAMPLE 2

A silicon single crystal rod having a predetermined diameter was pulled based on the expression (C). In this example, the PID constant was set for the top portion.

<Comparison Test and Evaluation>

Figure 13:
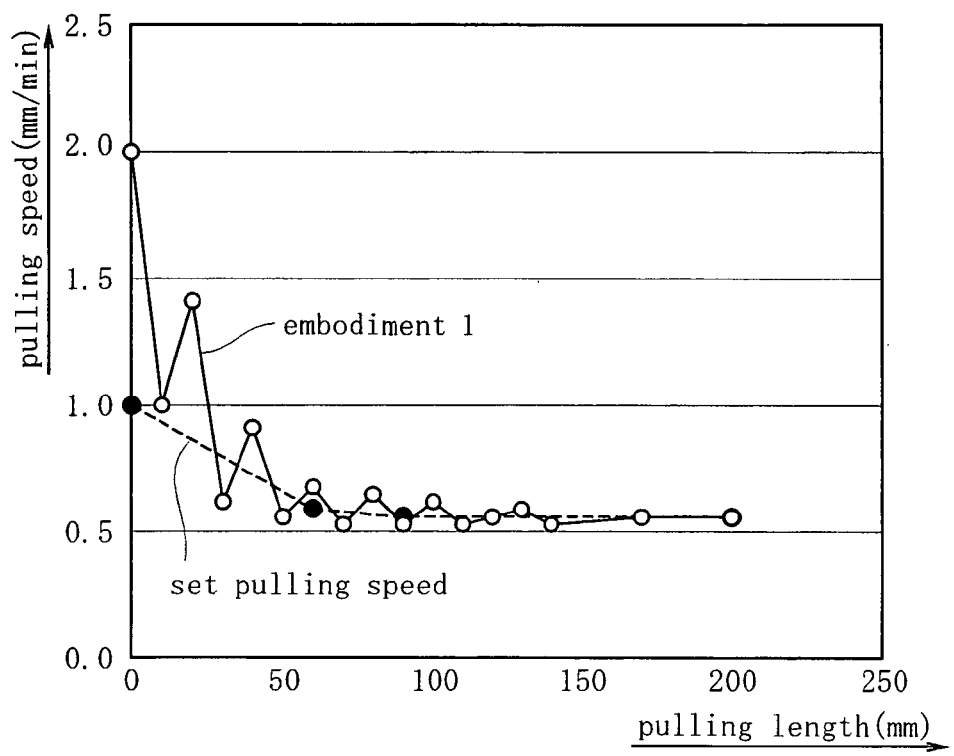
FIG. 13 is a view showing a change in pulling speed with respect to a change in a pulling length of the silicon single crystal rod according to Embodiment 1.
Figure 14:
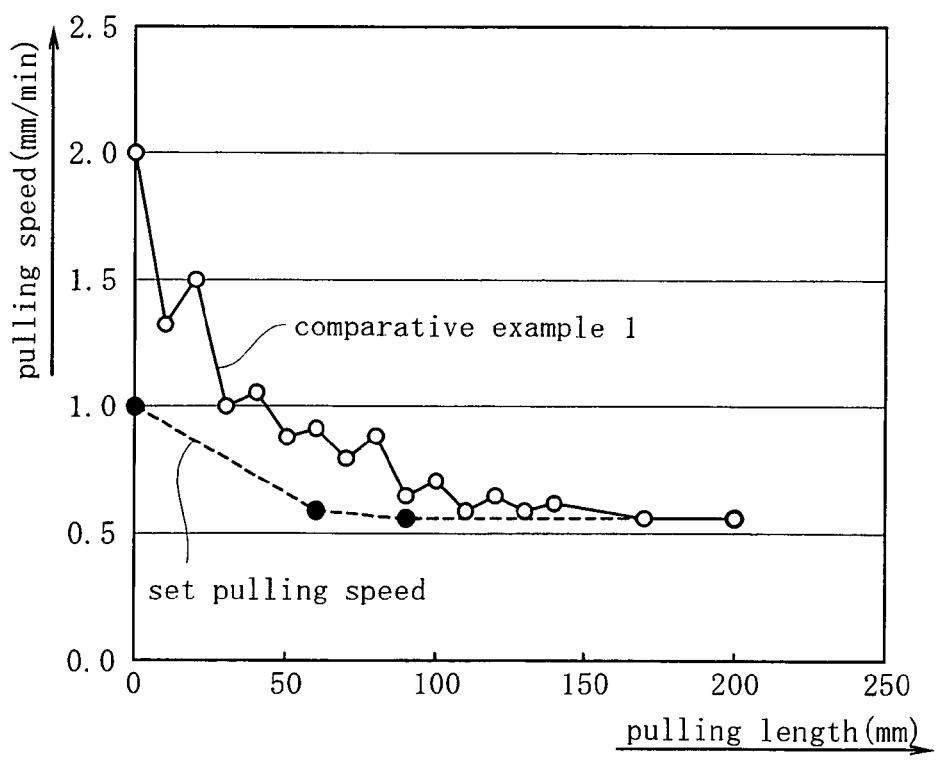
FIG. 14 is a view showing a change in pulling speed with respect to a change in pulling length of the silicon single crystal rod according to Comparative Example 1.
Figure 15:
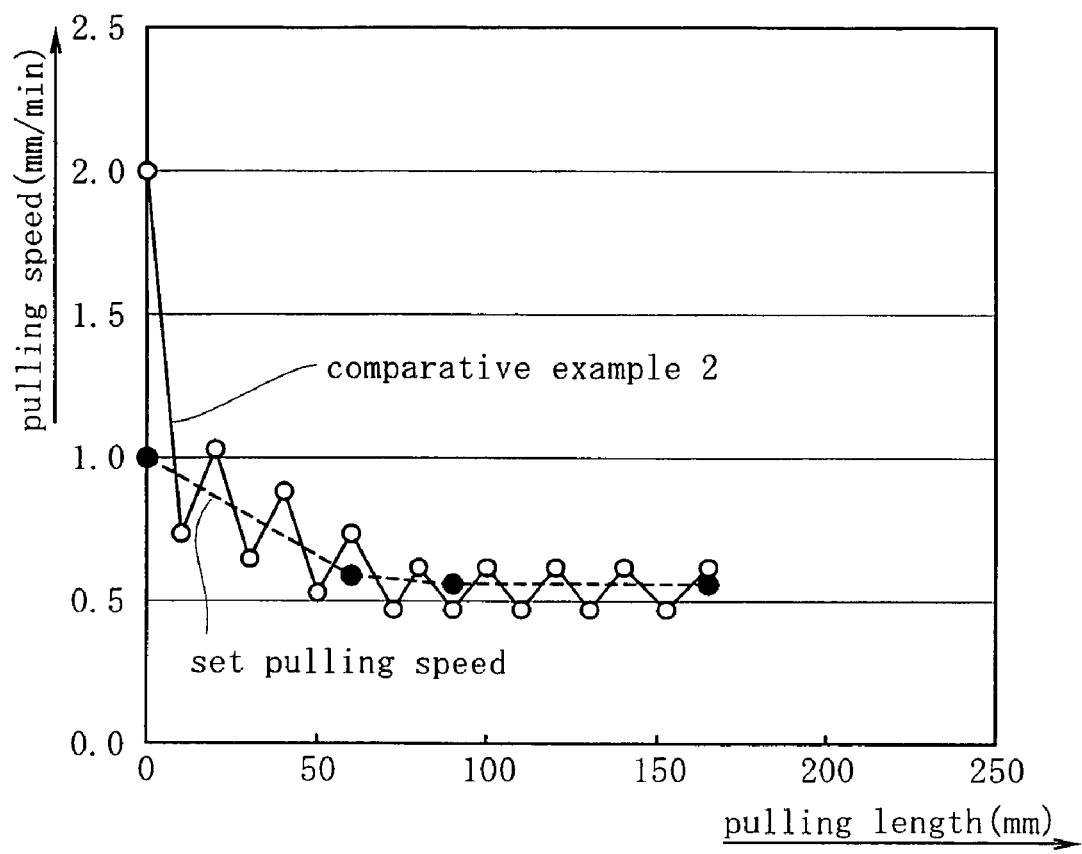
FIG. 15 is a view showing a change in pulling speed with respect to a change in pulling length of the silicon single crystal rod according to Comparative Example 2.

FIGS. 13 to 15 show changes in the actual pulling speed with respect to the set pulling speed in Embodiment 1, Comparative Example 1 and Comparative Example 2.

As apparent from FIGS. 13 to 15, the pulling length until the actual pulling speed is converged on the set pulling speed is not less than approximately 150 mm which is relatively long (FIG. 14) in Comparative Example 1, and a fluctuation in speed at the portion following the top portion is large and the quality is uneven (FIG. 15) in Comparative Example 2, whereas the pulling length until the actual pulling speed is converged on the set pulling speed is reduced to approximately 100 mm (FIG. 13) in Embodiment 1.

Embodiment2>

Figure 16:
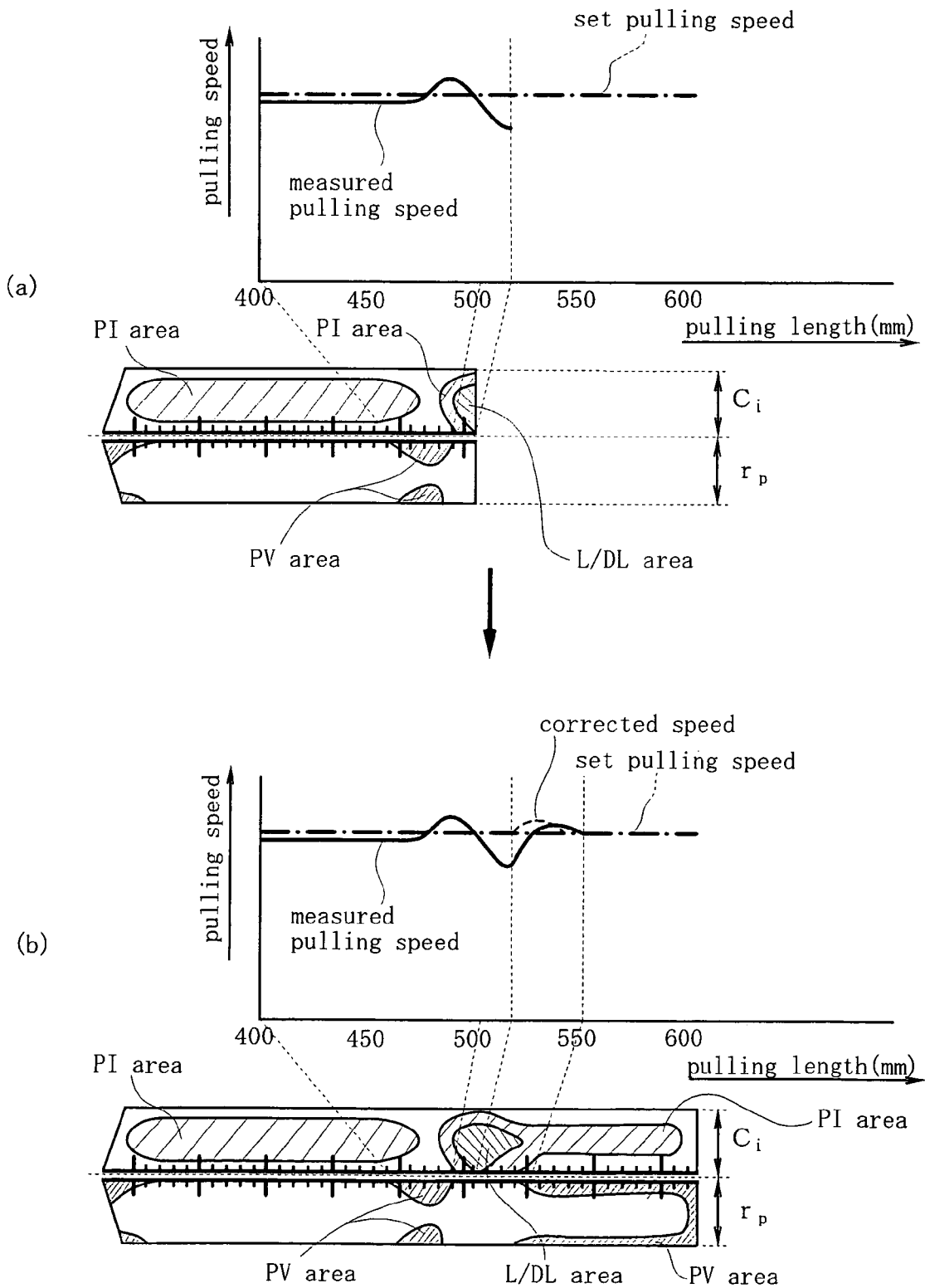
FIG. 16 is a view showing a state of reducing occurrence of a defective portion by correcting a pulling speed and a heater temperature when occurrence of the defective portion in the silicon single crystal rod according to Embodiment 2 is predicted.

As shown in FIG. 16(a), a silicon single crystal rod having a predetermined diameter was grown until a predetermined time, and then the quality was predicted. In this example, a pulling crystal length was 510 mm at the predetermined time. The pulling crystal length at the predetermined time and a measured pulling speed profile until this time are taken into consideration, and it is assumed that the pulling process of the silicon single crystal rod is terminated at the set pulling speed. Under these conditions, the quality prediction calculation for a crystal part grown until the predetermined time was performed. In this example, it was predicted from the calculation result that an L/DL area is generated at a part where the pulling speed is changed, i.e., in a range from 490 mm to 510 mm of the pulling length.

Based on this prediction result, a status where a defective portion is no longer generated was predicted while correcting the set pulling speed in order to reduce the predicted L/DL generation area, i.e., the defective portion. FIG. 16(b) shows a result of this prediction. In FIGS. 16(a) and (b), an interstitial silicon type defect is dominant in the PI area, and the PI area is an area which does not have a defect (L/DL) in which the interstitial silicon is aggregated. Furthermore, a vacancy type point defect is dominant in the PV area, and the PV area is an area which does not have a defect in which vacancies are aggregated.

In this example, since occurrence of L/DL was predicted, the set pulling speed is corrected to be higher. The set pulling speed becomes high by this correction, and an actual pulling speed is increased in association with this corrected speed. As a result, the speed returns to the set pulling speed at which such a defective portion as L/DL is not generated.

As described above, the measured pulling speed is rapidly matched with the set pulling speed at which no defective portion is generated by performing the quality prediction calculation concurrently with pulling of the crystal rod, thereby reducing defective portions. Furthermore, after the crystal is grown, a cut position and a quality confirmation position of the crystal can be determined based on the quality prediction result of the entire crystal length.

As described above, according to the present invention, the PID control in which the PID constant is changed on a plurality of stages is applied to the method which controls the silicon single crystal rod pulling speed so that the silicon single crystal rod has a target diameter and the method which controls the heater temperature so that the silicon single crystal rod has a target diameter. Therefore, the PID constant in the PID control is increased and the control which gives precedence to the diameter control for the silicon single crystal rod is performed when pulling the top portion of the silicon single crystal rod, and the PID constant in the PID control is gradually reduced and the control which gives precedence to the pulling speed control for the silicon single crystal rod is performed when pulling the portion following the top portion of the silicon single crystal rod. As a result, a correction quantity of the pulling speed with respect to the diameter deviation is increased and a fluctuation in diameter of the top portion can be rapidly stabilized when pulling the top portion of the silicon single crystal rod, and a correction quantity of the pulling speed with respect to the diameter deviation is reduced and a fluctuation in diameter of the portion following the top portion can be suppressed to the minimum level when pulling the portion following the top portion of the silicon single crystal rod.

Moreover, when the method which directly feeds back the diameter deviation between the target diameter and the measured diameter of the silicon single crystal rod to the method which performs the PID control over the pulling speed for the silicon single crystal rod so that the silicon single crystal rod has the target diameter is combined with the method which feeds back a change quantity of the diameter deviation as a deviation to the current pulling speed, the pulling speed at the time of the PID control feedback to the previous silicon single crystal rod pulling speed is determined as a reference, a change quantity obtained by subtracting the previous diameter deviation between the target diameter and the measured diameter of the silicon single crystal rod from the current diameter deviation between the target diameter and the measured diameter of the silicon single crystal rod is determined as a deviation, and the previous pulling speed is corrected in the pulling operation for the portion following the top portion of the silicon single crystal rod. As a result, a fluctuation in the pulling speed of the silicon single crystal rod can be further suppressed in the pulling operation for the portion following the top portion.

Additionally, when a change quantity of the diameter deviation between the target diameter and the measured diameter of the silicon single crystal rod is determined as a deviation and fed back to the pulling speed of the silicon single crystal rod, the pulling speed is subjected to the PID control so as not to exceed the maximum fluctuation breadth of the correction with respect to the current pulling speed. As a result, when the maximum fluctuation breadth of the correction with respect to the current pulling speed is exceeded when pulling the silicon single crystal rod, this correction is restricted to the maximum fluctuation breadth, and hence a fluctuation in the pulling speed of the silicon single crystal rod can be suppressed to the minimum level.

Further, whether a defective portion is generated in the silicon single crystal rod is predicted by performing the silicon single crystal rod quality prediction calculation from the pulling speed actual measurement profile and the set pulling speed concurrently with the actual pulling of the silicon single crystal rod. When occurrence of a defective portion is predicted, a corrected pulling speed for the silicon single crystal rod and a corrected heater temperature are calculated and fed back to the set pulling speed and the set heater temperature. As a result, occurrence of a defective portion in the silicon single crystal rod can be reduced or avoided.

Furthermore, as to the method of the silicon single crystal rod quality prediction calculation and the method of corrected pulling speed calculation, a convection of the silicon melt under a predetermined silicon single crystal rod manufacturing condition is first taken into consideration, and a concentration distribution and a size distribution of a defect in the silicon single crystal rod are obtained through a computer by acquiring an internal temperature of the silicon single crystal rod so that a calculated solid-liquid interface shape of the silicon single crystal rod and the silicon melt substantially matches with an actual shape when pulling the silicon single crystal rod as well as acquiring a temperature distribution in the silicon single crystal rod in the cooling process, i.e., by considering the effects of gradual cooling and rapid cooling of the silicon single crystal rod in the cooling process of the silicon single crystal rod separated from the silicon melt. Then, the first isoconcentration line and the first distribution line in the silicon single crystal rod are obtained by the calculation, and a difference between the maximum value of the inflection point of the first isoconcentration line and the minimum value of the inflection point of the first distribution line is obtained by the calculation. Thereafter, the parameter in the silicon single crystal rod manufacturing condition is changed, and the difference between the maximum value of the inflection point of the first isoconcentration line and the minimum value of the inflection point of the first distribution line is obtained by the calculation like the above-described example. Moreover, a silicon single crystal rod manufacturing condition under which the difference between the maximum value of the inflection point of the first isoconcentration line and the minimum value of the inflection point of the first distribution line is obtained. As a result, a silicon single crystal rod manufacturing condition under which a non-defective area expands on the maximum level in the pulling direction and the radial direction of the silicon single crystal rod can be accurately acquired by the calculation.

Additionally, the second isoconcentration line and the second distribution line in the silicon single crystal rod are obtained by the calculation, and a difference between the maximum value of the inflection point of the second isoconcentration line and the minimum value of the inflection point of the second distribution line is obtained by the calculation. Then, the parameter in the silicon single crystal rod manufacturing condition is changed, and the difference between the maximum value of the inflection point of the second isoconcentration line and the minimum value of the inflection point of the second distribution line is acquired by the calculation like the above example. Further, even if the silicon single crystal rod manufacturing condition under which the difference between the maximum value of the inflection point of the first isoconcentration line and the minimum value of the inflection point of the first distribution line is obtained, the same advantage as that in the above example can be obtained.

INDUSTRIAL APPLICABILITY

The method for manufacturing the silicon single crystal according to the present invention can be utilized for manufacturing a fine wafer having no defect by subjecting the silicon single crystal rod pulled by the Czochralski method to the PID control and suppressing a fluctuation in diameter of the silicon single crystal rod.

The invention claimed is:

1. A method for manufacturing a silicon single crystal rod which pulls a silicon single crystal rod (24) from a silicon melt (13) made molten by a heater (17), detects a change in diameter of the silicon single crystal rod (24) in the pulling process at time intervals, and feeds back an output of the detection to the pulling speed of the silicon single crystal rod (24) and the temperature of the heater (17), thereby controlling the diameter of the silicon single crystal rod (24), and wherein a PID control in which a PID constant is changed on a plurality of stages is applied to controlling the pulling speed of the silicon single crystal rod (24) and the controlling of the temperature of the heater (17) so that the silicon single crystal rod (24) has a desired target diameter, wherein the PID constant in the PID control is increased and the control which gives precedence to the diameter control for the silicon single crystal rod is performed when pulling the top portion of the silicon single crystal rod, and wherein the PID constant in the PID control is gradually reduced and the control which gives precedence to the pulling speed control for the silicon single crystal rod is performed when pulling the portion following the top portion of the silicon single crystal rod.

2. A method for manufacturing a silicon single crystal rod which pulls a silicon single crystal rod (24) from a silicon melt (13) made molten by a heater (17), detects a change in diameter of the silicon single crystal rod (24) in the pulling process at time intervals, and feeds back an output of the detection to the pulling speed of the silicon single crystal rod (24) and the temperature of the heater (17), thereby controlling the diameter of the silicon single crystal rod (24), and wherein the diameter deviation between a desired target diameter and a measured diameter of the silicon single crystal rod (24) is imputed to a PID control so that the silicon single crystal rod (24) has the target diameter and which further comprises feeding back a change frequency quantity of the diameter deviation as a deviation to a current pulling speed, and wherein the pulling speed at the time of the PID control feedback to the previous silicon single crystal rod pulling speed is determined as a reference, a change quantity obtained by subtracting the previous diameter deviation between the target diameter and the measured diameter of the silicon single crystal rod from the current diameter deviation between the target diameter and the measured diameter of the silicon single crystal rod is determined as a deviation, and the previous pulling speed is corrected in the pulling operation for the portion following the top portion of the silicon single crystal rod.

3. A method for manufacturing a silicon single crystal rod which pulls a silicon single crystal rod (24) from a silicon melt (13) made molten by a heater (17), detects a change in diameter of the silicon single crystal rod (24) in the pulling process at time intervals, and feeds back an output of the detection to a pulling speed of the silicon single crystal rod (24) and a temperature of the heater (17), thereby controlling a diameter of the silicon single crystal rod (24), wherein, when feeding back a change quantity of a diameter deviation between a target diameter and a measured diameter of the silicon single crystal rod (24) as a deviation to the pulling speed of the silicon single crystal rod (24), the pulling speed is subjected to a PID control so as not to exceed a maximum fluctuation breadth of correction with respect to a current pulling speed, and wherein, when the maximum fluctuation breadth of the correction with respect to the current pulling speed is exceeded when pulling the silicon single crystal rod, this correction is restricted to the maximum fluctuation breadth.

4. A method for manufacturing a silicon single crystal rod wherein a PID control in which a PID constant is changed on a plurality of stages is applied to a method which controls the pulling speed of the silicon single crystal rod so that the silicon single crystal rod has a target diameter and a method which controls the temperature of the heater (17) so that the silicon single crystal rod has the target diameter, wherein a quality prediction calculation for the silicon single crystal rod (24) is performed by using a pulling speed actual measurement profile from start of puling to a predetermined time and a set pulling speed from start of puling to end of puling concurrently with pulling of the silicon single crystal rod (24), and whether a defective portion is generated in the silicon single crystal rod (24) is predicted, and wherein, when generation of the defective portion is predicted, a corrected pulling speed of the silicon single crystal rod (24) and a corrected heater temperature which are used to correct the defective portion are calculated, and the corrected pulling speed and the corrected heater temperature are fed back to the set pulling speed and the set heater temperature, and wherein the quality prediction calculation and the corrected pulling speed calculation for the silicon single crystal rod (24) are performed by a defect simulation method which maximizes a non-defective area in the silicon single crystal rod (24) by using a computer, the defect simulation method comprising:

a step of obtaining a temperature distribution in the silicon single crystal rod (24) which grows from the silicon melt (13) while taking a convection of the silicon melt (13) into consideration under a condition for manufacturing the silicon single crystal rod (24) with a parameter P1;

a step of predicting concentration distributions and size distributions of a void and a high-temperature oxygen precipitate in the silicon single crystal rod (24) by obtaining the temperature distribution in the silicon single crystal rod (24) in the cooling process;

a step of obtaining a difference between a maximum value of an inflection point of a first isoconcentration line and a minimum value of an inflection point of a first distribution line by a calculation after acquiring the first isoconcentration line and the first distribution line in the silicon single crystal rod (24) by a calculation;

a step of obtaining the difference between the maximum value of the inflection point of the first isoconcentration line and the minimum value of the inflection point of the first distribution line by the calculation while sequentially changing the parameter in the condition for manufacturing the silicon single crystal rod (24) from $P_2$ to $P_N$; and a step of obtaining a condition for manufacturing the silicon single crystal rod (24) under which the difference between the maximum value of the inflection point of the first isoconcentration line and the minimum value of the inflection point of the first distribution line becomes maximum.

5. The method for manufacturing a silicon single crystal rod according to claim 4, wherein the quality prediction calculation and the corrected pulling speed calculation for the silicon single crystal rod (24) are performed by a defect simulation method which maximizes a non-defective area in the silicon single crystal rod (24) by using a computer, the defect simulation method comprising:

a step of obtaining a temperature distribution in the silicon single crystal rod (24) which grows from the silicon melt (13) while taking a convection of the silicon melt (13) into consideration under a condition for manufacturing the silicon single crystal rod (24) with a parameter P1;

a step of predicting concentration distributions and size distributions of a void and a high-temperature oxygen precipitate in the silicon single crystal rod (24) by obtaining the temperature distribution in the silicon single crystal rod (24) in the cooling process;

a step of obtaining a difference between a maximum value of an inflection point of a second isoconcentration line and a minimum value of an inflection point of a second distribution line by a calculation after acquiring the second isoconcentration line and the second distribution line in the silicon single crystal rod (24) by a calculation;

a step of obtaining the difference between the maximum value of the inflection point of the second isoconcentration line and the minimum value of the inflection point of the second distribution line by the calculation while sequentially changing the parameter in the condition for manufacturing the silicon single crystal rod (24) from P2 to PN; and a step of obtaining a condition for manufacturing the silicon single crystal rod (24) under which the difference between the maximum value of the inflection point of the second isoconcentration line and the minimum value of the inflection point of the second distribution line becomes maximum.

6. A method for manufacturing a silicon single crystal rod wherein a method which directly feeds back a diameter deviation between a target diameter and a measured diameter of the silicon single crystal rod (24) to a method which subjects the pulling speed of the silicon single crystal rod (24) to a PID control so that the silicon single crystal rod (24) has the target diameter is combined with a method which feeds back a change quantity of the diameter deviation as a deviation to a current pulling speed, wherein a quality prediction calculation for the silicon single crystal rod (24) is performed by using a pulling speed actual measurement profile from start of puling to a predetermined time and a set pulling speed from start of puling to end of puling concurrently with pulling of the silicon single crystal rod (24), and whether a defective portion is generated in the silicon single crystal rod (24) is predicted, and wherein, when generation of the defective portion is predicted, a corrected pulling speed of the silicon single crystal rod (24) and a corrected heater temperature which are used to correct the defective portion are calculated, and the corrected pulling speed and the corrected heater temperature are fed back to the set pulling speed and the set heater temperature, and wherein the quality prediction calculation and the corrected pulling speed calculation for the silicon single crystal rod (24) are performed by a defect simulation method which maximizes a non-defective area in the silicon single crystal rod (24) by using a computer, the defect simulation method comprising:

a step of obtaining a temperature distribution in the silicon single crystal rod (24) which grows from the silicon melt (13) while taking a convection of the silicon melt (13) into consideration under a condition for manufacturing the silicon single crystal rod (24) with a parameter P1;

a step of predicting concentration distributions and size distributions of a void and a high-temperature oxygen precipitate in the silicon single crystal rod (24) by obtaining the temperature distribution in the silicon single crystal rod (24) in the cooling process;

a step of obtaining a difference between a maximum value of an inflection point of a first isoconcentration line and a minimum value of an inflection point of a first distribution line by a calculation after acquiring the first isoconcentration line and the first distribution line in the silicon single crystal rod (24) by a calculation;

a step of obtaining the difference between the maximum value of the inflection point of the first isoconcentration line and the minimum value of the inflection point of the first distribution line by the calculation while sequentially changing the parameter in the condition for manufacturing the silicon single crystal rod (24) from P2 to PN; and a step of obtaining a condition for manufacturing the silicon single crystal rod (24) under which the difference between the maximum value of the inflection point of the first isoconcentration line and the minimum value of the inflection point of the first distribution line becomes maximum.

7. The method for manufacturing a silicon single crystal rod according to claim 6, wherein the quality prediction calculation and the corrected pulling speed calculation for the silicon single crystal rod (24) are performed by a defect simulation method which maximizes a non-defective area in the silicon single crystal rod (24) by using a computer, the defect simulation method comprising:

a step of obtaining a temperature distribution in the silicon single crystal rod (24) which grows from the silicon melt (13) while taking a convection of the silicon melt (13) into consideration under a condition for manufacturing the silicon single crystal rod (24) with a parameter P1;

a step of predicting concentration distributions and size distributions of a void and a high-temperature oxygen precipitate in the silicon single crystal rod (24) by obtaining the temperature distribution in the silicon single crystal rod (24) in the cooling process;

a step of obtaining a difference between a maximum value of an inflection point of a second isoconcentration line and a minimum value of an inflection point of a second distribution line by a calculation after acquiring the second isoconcentration line and the second distribution line in the silicon single crystal rod (24) by a calculation;

a step of obtaining the difference between the maximum value of the inflection point of the second isoconcentration line and the minimum value of the inflection point of the second distribution line by the calculation while sequentially changing the parameter in the condition for manufacturing the silicon single crystal rod (24) from P2 to PN; and a step of obtaining a condition for manufacturing the silicon single crystal rod (24) under which the difference between the maximum value of the inflection point of the second isoconcentration line and the minimum value of the inflection point of the second distribution line becomes maximum.

8. A method for manufacturing a silicon single crystal rod wherein, when feeding back a change quantity of a diameter deviation between a target diameter and a measured diameter of the silicon single crystal rod (24) as a deviation to the pulling speed of the silicon single crystal rod (24), the pulling speed is subjected to a PID control so as not to exceed a maximum fluctuation breadth of correction with respect to a current pulling speed, and wherein a quality prediction calculation for the silicon single crystal rod (24) is performed by using a pulling speed actual measurement profile from start of puling to a predetermined time and a set pulling speed from start of puling to end of puling concurrently with pulling of the silicon single crystal rod (24), and whether a defective portion is generated in the silicon single crystal rod (24) is predicted, and wherein, when generation of the defective portion is predicted, a corrected pulling speed of the silicon single crystal rod (24) and a corrected heater temperature which are used to correct the defective portion are calculated, and the corrected pulling speed and the corrected heater temperature are fed back to the set pulling speed and the set heater temperature, and wherein the quality prediction calculation and the corrected pulling speed calculation for the silicon single crystal rod (24) are performed by a defect simulation method which maximizes a non-defective area in the silicon single crystal rod (24) by using a computer, the defect simulation method comprising:

a step of obtaining a temperature distribution in the silicon single crystal rod (24) which grows from the silicon melt (13) while taking a convection of the silicon melt (13) into consideration under a condition for manufacturing the silicon single crystal rod (24) with a parameter P1;

a step of predicting concentration distributions and size distributions of a void and a high-temperature oxygen precipitate in the silicon single crystal rod (24) by obtaining the temperature distribution in the silicon single crystal rod (24) in the cooling process;

a step of obtaining a difference between a maximum value of an inflection point of a first isoconcentration line and a minimum value of an inflection point of a first distribution line by a calculation after acquiring the first isoconcentration line and the first distribution line in the silicon single crystal rod (24) by a calculation;

a step of obtaining the difference between the maximum value of the inflection point of the first isoconcentration line and the minimum value of the inflection point of the first distribution line by the calculation while sequentially changing the parameter in the condition for manufacturing the silicon single crystal rod (24) from $P_2$ to $P_N$; and a step of obtaining a condition for manufacturing the silicon single crystal rod (24) under which the difference between the maximum value of the inflection point of the first isoconcentration line and the minimum value of the inflection point of the first distribution line becomes maximum.

9. The method for manufacturing a silicon single crystal rod according to claim 8, wherein the quality prediction calculation and the corrected pulling speed calculation for the silicon single crystal rod (24) are performed by a defect simulation method which maximizes a non-defective area in the silicon single crystal rod (24) by using a computer, the defect simulation method comprising:

a step of obtaining a temperature distribution in the silicon single crystal rod (24) which grows from the silicon melt (13) while taking a convection of the silicon melt

(13) into consideration under a condition for manufacturing the silicon single crystal rod (24) with a parameter P1;

a step of predicting concentration distributions and size distributions of a void and a high-temperature oxygen precipitate in the silicon single crystal rod (24) by obtaining the temperature distribution in the silicon single crystal rod (24) in the cooling process;

a step of obtaining a difference between a maximum value of an inflection point of a second isoconcentration line and a minimum value of an inflection point of a second distribution line by a calculation after acquiring the second isoconcentration line and the second distribution line in the silicon single crystal rod (24) by a calculation;

a step of obtaining the difference between the maximum value of the inflection point of the second isoconcentration line and the minimum value of the inflection point of the second distribution line by the calculation while sequentially changing the parameter in the condition for manufacturing the silicon single crystal rod (24) from P2 to PN; and a step of obtaining a condition for manufacturing the silicon single crystal rod (24) under which the difference between the maximum value of the inflection point of the second isoconcentration line and the minimum value of the inflection point of the second distribution line becomes maximum.

* * * * *